(12) United States Patent
Hashimoto et al.

(10) Patent No.: US 6,674,119 B2
(45) Date of Patent: Jan. 6, 2004

(54) NON-VOLATILE SEMICONDUCTOR MEMORY DEVICE AND SEMICONDUCTOR INTEGRATED CIRCUIT

(75) Inventors: Hiroshi Hashimoto, Kawasaki (JP); Koji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/105,212

(22) Filed: Mar. 26, 2002

(65) Prior Publication Data

US 2003/0042529 A1 Mar. 6, 2003

(30) Foreign Application Priority Data

Jul. 2, 2001 (JP) .......................................... 2001-201055

(51) Int. Cl.[7] ............................................. H01L 29/788
(52) U.S. Cl. ......................... 257/315; 257/316; 257/318
(58) Field of Search ................................. 257/315, 316, 257/318

(56) References Cited

U.S. PATENT DOCUMENTS 6,031,771 A  *  2/2000  Yiu et al. .................... 365/200
6,166,954 A  * 12/2000  Chern ...................... 365/185.14

FOREIGN PATENT DOCUMENTS

| JP | 8-227983 | 9/1996 |
| JP | 10-223782 | 8/1998 |

* cited by examiner

*Primary Examiner*—Hoai Ho
*Assistant Examiner*—Tu-Tu Ho
(74) *Attorney, Agent, or Firm*—Westerman, Hattori, Daniels & Adrian

(57) ABSTRACT

A non-volatile semiconductor memory device includes a p-type Si substrate, an n-type well formed in the Si substrate, a control gate of a p-type buried diffusion region formed in the n-type well, an active region formed in the Si substrate in the vicinity of the n-type well and covered by a tunneling insulation film, and a floating gate electrode formed on the Si substrate so as to achieve a capacitance coupling with the p-type buried diffusion region, wherein the floating gate electrode extends on the active region over the tunneling insulation film, and the active region including a pair of n-type diffusion regions are formed at both sides of the floating gate electrode as source and drain regions, the n-type diffusion region forming the source region having an n--type diffusion region at the side facing the n-type diffusion region forming said drain region.

6 Claims, 27 Drawing Sheets

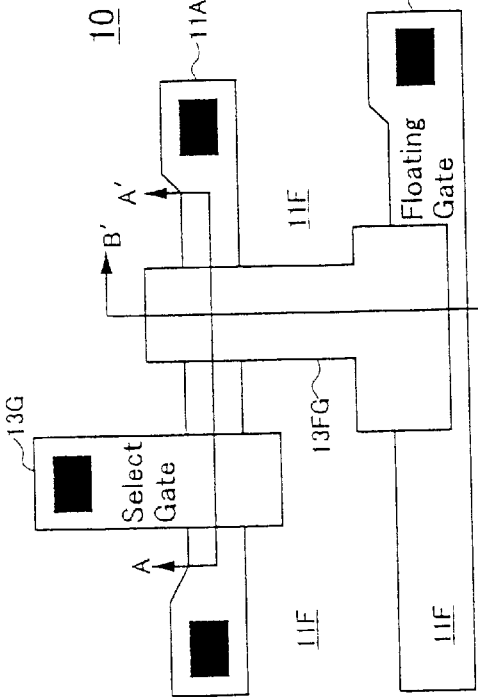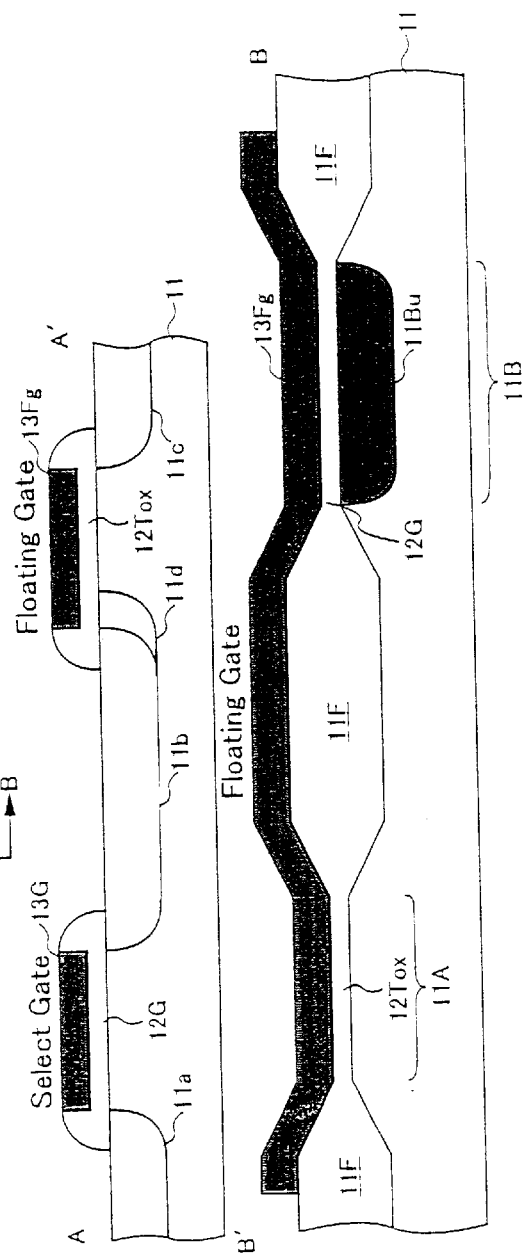
FIG. 1A
RELATED ART
FIG. 1B
RELATED ART
FIG. 1C
RELATED ART

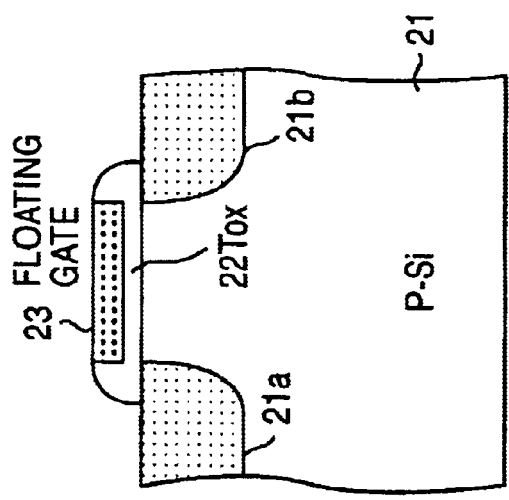
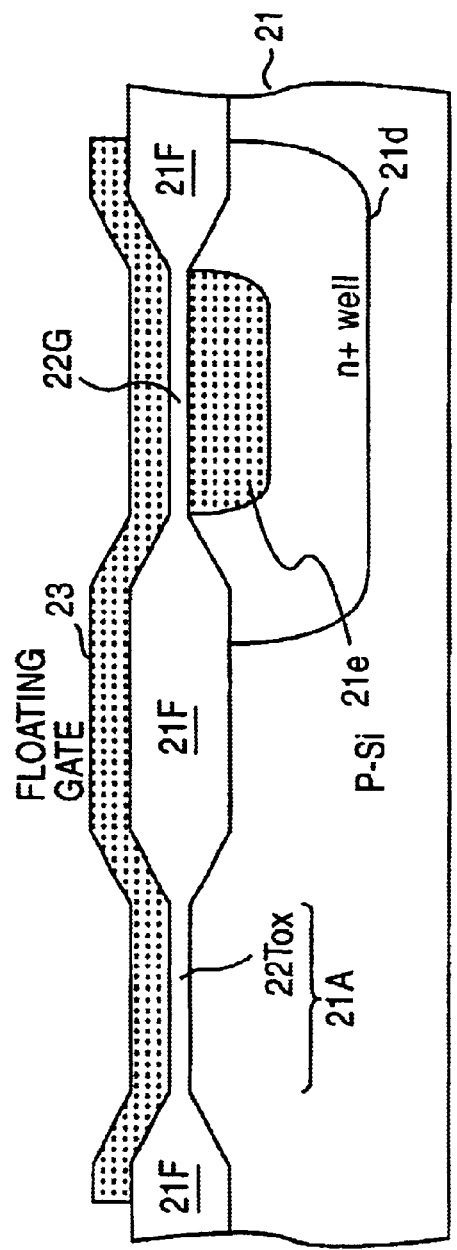
FIG. 9A
FIG. 9B

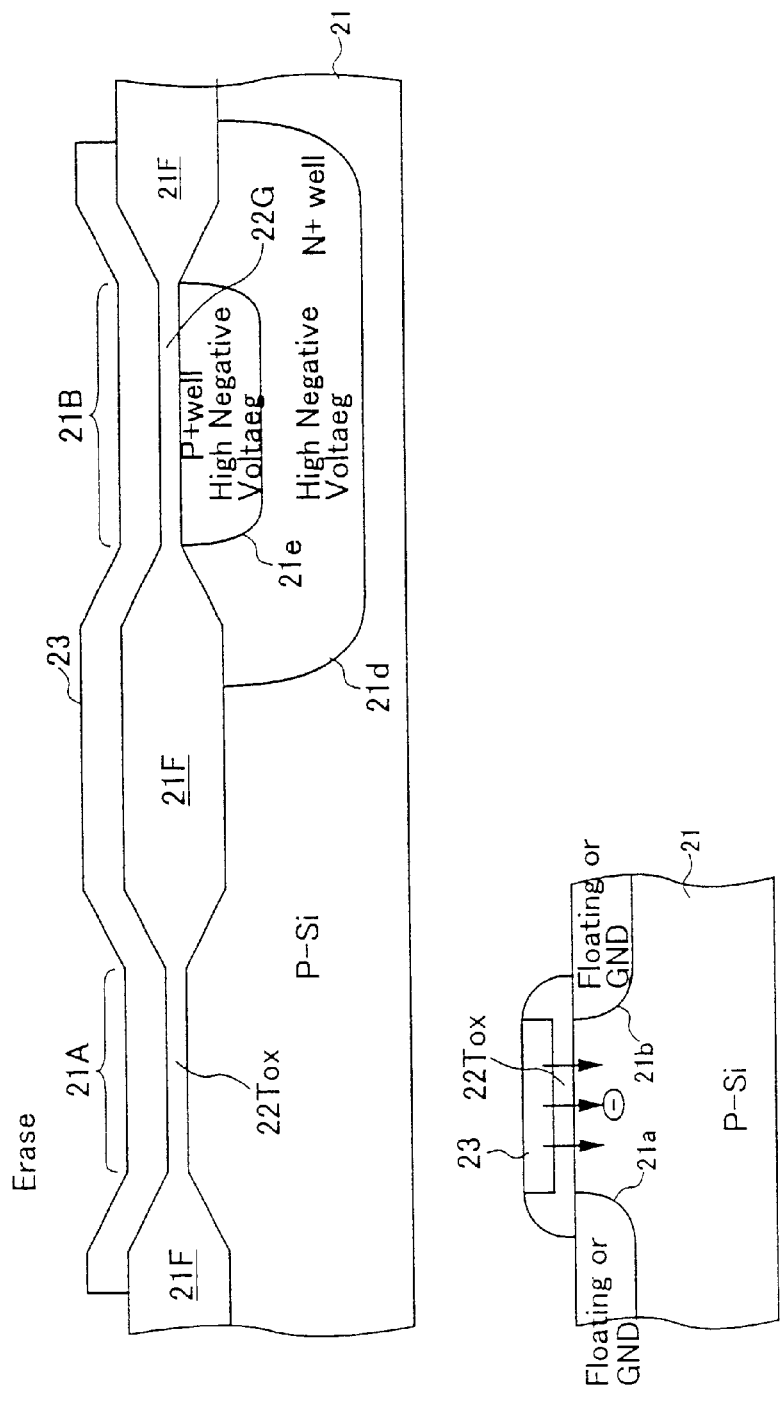

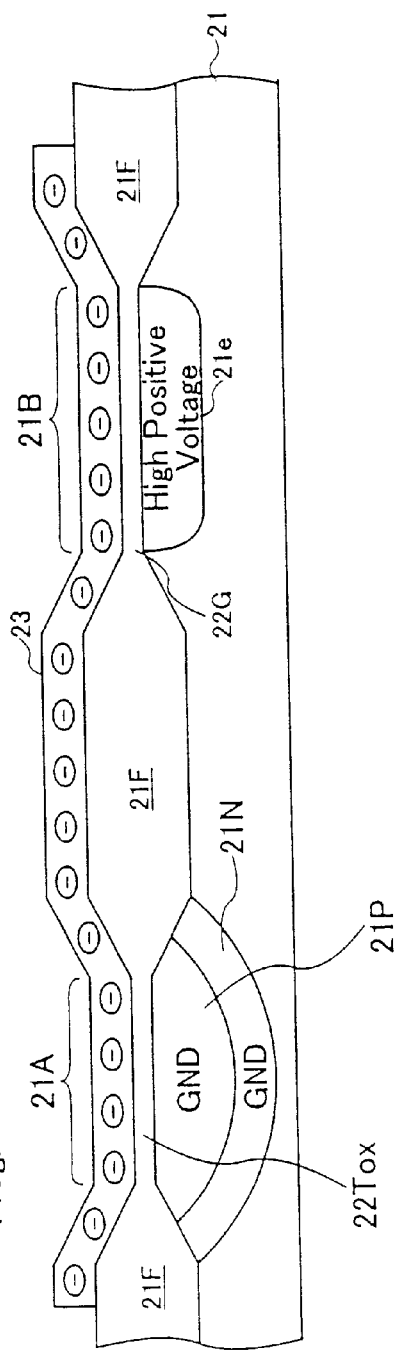
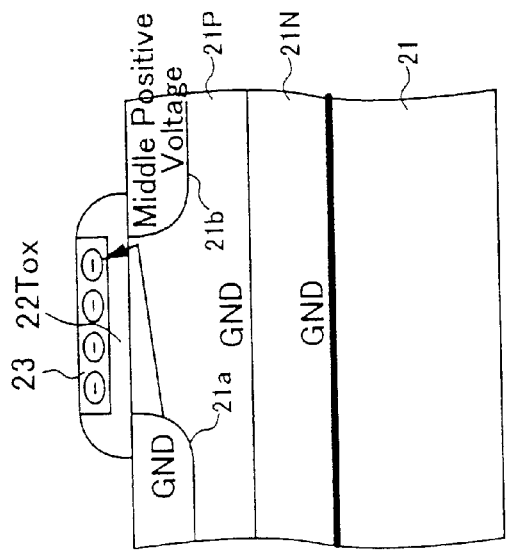
FIG. 17A
FIG. 17B

NON-VOLATILE SEMICONDUCTOR MEMORY DEVICE AND SEMICONDUCTOR INTEGRATED CIRCUIT

CROSS-REFERENCE TO RELATED APPLICATION

The present application is based on Japanese priority application No.2001-201055 filed on Jul. 2, 2001, the entire contents of which are hereby incorporated by reference.

BACKGROUND OF THE INVENTION

The present invention generally relates to semiconductor devices. Especially it is related to a non-volatile semiconductor memory device.

A non-volatile semiconductor memory device is a semiconductor memory device capable of holding information over long time period even if the supply of electric power is turned off. EEPROMs and flash memory devices are typical examples.

In these semiconductor memory devices, information is held in a floating gate electrode in the form of electric charges. Especially, as for a flash memory device, the cell area is small and it is suited to construct a large scale integrated circuit together with other semiconductor devices, especially logic semiconductor devices.

A typical conventional flash memory device has the floating gate electrode formed on a channel region via an intervening tunneling oxide film. Furthermore, a control electrode is formed on the floating gate electrode via an insulation film.

However, the flash memory device having such a stacked electrode structure has a problem in that the fabrication process thereof is complex.

On the other hand, a flash memory device having a single-layer gate structure is proposed in a related art of the present invention.

FIG. 1A is a plan view showing the construction of a flash memory device 10 according to such a related art, while FIGS. 1B and 1C show the cross-sectional view taken along a A–A' line and B–B' line of FIG. 1A.

Referring to FIGS. 1A–1C, an active region 11A is defined by a field oxide film 11F formed on a Si substrate 11, and another active region 11B including a buried diffusion region 11Bu is defined in the vicinity of the active region 11A so as to extend parallel to the active region 11A. Further, diffusion regions 11a and 11b of n+-type are formed inside the active region 11A as shown in the cross-sectional view of FIG. 1B.

On the Si substrate 11, a gate electrode 13G is formed via a gate oxide film 12G at the part located between the diffusion regions 11a and 11b. By providing the gate electrode 13G, there is formed a MOS transistor having a channel region between the diffusion regions 11a and 11b in the active region 11A. This MOS transistor is used for reading the information.

Furthermore a different n+-type diffusion region 11c is formed in the vicinity of the diffusion region 11b inside the active region 11A at the opposite side of the diffusion region 11a, as shown in the cross-sectional view of FIG. 1B. Between the diffusion regions 11b and 11c, there is formed a floating gate electrode 13FG via a tunneling oxide film 12Tox. Further, an LDD region 11d of n-type is formed in a part of the diffusion region 11b at the side facing to the diffusion region 11c.

Referring to the cross-sectional view of FIG. 1C, the floating gate electrode 13FG on the gate oxide film 12G extends over the field oxide film 11F toward the active region 11B, wherein the floating gate electrode 13FG extends further over the gate oxide film 12G covering the surface of Si substrate 11 in the active region 11B.

FIGS. 2A and 2B show the writing operation of the flash memory device 10 of FIGS. 1A–1C.

Referring to FIGS. 2A and 2B, the diffusion region 11b is grounded and a positive voltage of +5–+10V is applied to the diffusion region 11c at the time of writing. Thereby, hot electrons are formed in the vicinity of the diffusion region 11c.

Simultaneously, a positive writing voltage of +15–20V is applied to the buried diffusion region 12Bu in the active region 11B. With this, the potential of the floating gate electrode 13Fg, which is capacitance-coupled to the buried diffusion region 12Bu, is lowered via the gate insulation film 12G. As a result, there occurs injection of the hot electrons into the floating gate electrode 13Fg in the active region 11A, and the electrons thus injected are held stability in the floating gate electrode 13Fg.

FIGS. 3A and 3B show the erasing operation of flash memory device 10 of FIGS. 1A–1C.

Referring to FIGS. 3A and 3B, the diffusion region 11c is set to a floating state at the time of the erasing operation of the flash memory device and a positive erasing voltage of +15–+20V is applied to the diffusion region 11b. As a result, the potential of the diffusion region 11b is lowered and the electrons accumulated in the floating gate electrode 13Fg are pulled out to the diffusion regions 11d and 11b through the tunneling insulation film 12Tox.

Thus, the flash memory device 10 of FIGS. 1A–1C has a desirable characteristic in that the production of the device is easy due to the single-layer structure of the gate electrode.

On the other hand, as will be understood from the plane view of FIG. 1A, the flash memory device 10 has a problem in that the memory cell area tends to become large due to the use of two gate electrodes, the selection gate electrode 13G and the floating gate electrode 13Fg, at the time of reading.

SUMMARY OF THE INVENTION

Accordingly, it is a general object of the present invention to provide a novel and useful semiconductor device and the fabrication process thereof wherein the foregoing problems are eliminated.

Another and more specific object of the present invention is to provide a flash memory device of single-layer gate structure that can reduce the memory cell area.

Another object of the present invention is to provide a non-volatile semiconductor memory device, comprising:

a p-type Si substrate;

an n-type well formed in said Si substrate;

a control gate formed of a p-type buried diffusion region formed in said n-type well;

an active region formed in said Si substrate in the vicinity of said n-type well, said active region being covered by a tunneling insulation film; and a floating gate electrode formed on a surface of said Si substrate so as to achieve a capacitance coupling with said p-type buried diffusion region, said floating gate electrode extending over said active region in a state that said tunneling insulation film is interposed between said floating gate electrode and said surface of said Si substrate, said active region including a pair of n-type diffusion regions at both sides of said floating gate electrode respectively as a source region and a drain region, said n-type diffusion region forming said source region having an n−-type diffusion region at the side facing said n-type diffusion region forming said drain region.

Another object of the present invention is to provide a semiconductor integrated circuit having a non-volatile memory cell array, comprising:

a p-type Si substrate;

a plurality of n-type wells formed repeatedly on said Si substrate, each of said n-type wells extending in said Si substrate in a first direction;

a control gate formed of a p-type buried diffusion region, said p-type buried diffusion region being formed in each of said n-type wells so as to extend in said first direction;

a plurality of active regions formed on said Si substrate between a pair of adjacent n-type wells, each of said active regions extending in said first direction and being covered with a tunneling insulation film;

a floating gate electrode provided on each of said n-type wells so as to achieve a capacitance coupling with said p-type buried diffusion region in said n-type well via an insulation film covering said surface of said Si substrate, said floating gate electrode extending over an active region adjacent to n-type well;

n-type diffusion regions formed at both sides of said floating gate electrode in each of said active regions;

a pair of bit lines extending over said Si substrate in a second direction crossing said first direction across said plurality of n-type wells and said plurality of active regions, said bit lines making a contact with corresponding n-type diffusion regions in each of said active regions; and a plurality of word lines respectively extending over said Si substrate in said first direction in correspondence said plurality of n-type wells, each of said word lines making a contact with a control gate in a corresponding n-type well.

Another object of the present invention is to provide a semiconductor integrated circuit having a non-volatile memory cell array, comprising:

a p-type Si substrate;

a plurality of n-type wells formed on said Si substrate repeatedly, each of said n-type wells extending in said Si substrate in a first direction;

a pair of buried diffusion regions formed in each of said n-type wells so as to extend in said first direction, each of said pair of buried diffusion regions forming a control gate;

a pair of active region formed on a surface of said Si substrate in a part located between a pair of neighboring n-type wells, each of said active regions extending in said first direction and being covered with a tunneling insulation film;

a floating gate electrode provided on each of said n-type wells so as to achieve a capacitance coupling with one of said p-type buried diffusion regions in said n-type well via an insulation film covering said surface of said Si substrate, said floating gate electrode extending over said active region adjacent to said n-type well;

a pair of n-type diffusion regions formed in each of said active regions at both sides of said floating gate electrode;

a pair of bit lines extending over said Si substrate in a second direction crossing said first direction across said plurality of n-type wells and said plurality of active regions, each of said bit lines making a contact with a corresponding n-type diffusion region in each of said active regions; and a plurality of word lines extending over said Si substrate in said first direction respectively in correspondence to said plurality of n-type wells, each of said word lines making a contact with a control gate in a corresponding n-type well.

Another object of the present invention is to provide a non-volatile semiconductor device, comprising:

a p-type Si substrate;

an n-type buried diffusion region formed in said Si substrate as a control gate;

an active region formed in said Si substrate in the vicinity of said n-type buried diffusion region, said active region being covered by a tunneling insulation film; and a floating gate electrode formed over a surface of said Si substrate so as to make a capacitance coupling with said n-type buried diffusion region via an insulation film;

said active region including a triple-well structure formed of said p-type Si substrate, an n-type well formed in said Si substrate and a p-type well formed in said n-type well, said floating gate electrode extending over said active region in the state that said tunneling insulation film is interposed between said floating gate electrode and said surface of said Si substrate, said Si substrate including a pair of n-type diffusion regions in said p-type well at both sides of said floating gate electrode respectively as a source region and a drain region.

Another object of the present invention is to provide a semiconductor integrated circuit having a non-volatile memory cell array, comprising:

a p-type Si substrate;

a plurality of n-type buried diffusion regions formed on said Si substrate repeatedly, each of said n-type buried diffusion regions extending in a first direction and forming a control gate;

a triple-well structure formed on said Si substrate between a pair of neighboring n-type buried diffusion regions, said triple-well structure including said p-type substrate, an n-type well formed in said p-type Si substrate, and a p-type well formed in said n-type well;

an active region extending in said p-type well in said first direction, said active region being covered with a tunneling insulation film;

a floating gate electrode provided on said Si substrate so as to achieve a capacitance coupling with said n-type buried diffusion region via an insulation film covering a surface of said Si substrate, said floating gate electrode extending over an active region adjacent to said n-type buried diffusion region;

a pair of n-type diffusion regions formed in each of said active regions at both lateral sides of said floating gate electrode;

a pair of bit lines extending over said Si substrate in a second direction crossing said first direction across said plurality of n-type wells and said plurality of active regions, each of said bit lines making a contact with an n-type diffusion region in each of said plurality of active regions; and a plurality of word lines extending over said Si substrate in said first direction respectively in correspondence to said plurality of n-type wells, each of said word lines making a contact with a control gate in a corresponding n-type well.

Another object of the present invention is to provide a semiconductor integrated circuit device having a non-volatile memory cell array, comprising:

a p-type Si substrate;

a plurality of n-type buried diffusion regions formed on said Si substrate repeatedly in said first direction as a control gate;

a triple-well structure formed in a part of said Si substrate located between a pair of neighboring n-type buried diffusion regions and another pair of neighboring n-type buried diffusion regions, said triple-well structure including said p-type Si substrate, an n-type well formed in said Si substrate and a p-type well formed in said n-type well;

a pair of active regions extending in said first direction in said p-type well, each of said active regions being covered with a tunneling insulation film;

a floating gate electrode provided on said Si substrate so as to achieve a capacitance coupling with said n-type buried diffusion region via an insulation film covering a surface of said Si substrate, said floating gate electrode extending over said active region adjacent to said n-type buried diffusion region;

a pair of n-type diffusion regions formed in each of said active regions at both sides of said floating gate electrode;

a pair of bit lines extending over said Si substrate in a second direction crossing said first direction across said plurality of n-type wells and said plurality of active regions, each of said bit lines making a contact with said n-type diffusion region in said active regions; and a plurality of word lines extending over said Si substrate in said first direction respectively in correspondence to said plurality of n-type wells, each of said word lines making a contact with a corresponding control gate in said n-type wells.

Another object of the present invention is to provide a NAND-type non-volatile semiconductor memory device, comprising:

a p-type Si substrate;

a plurality of triple well structures each formed in said p-type Si substrate repeatedly, each of said triple well structures comprising said p-type Si substrate, an n-type well formed in said Si substrate so as to extend in said fist direction and a p-type well formed in said n-type well formed in said n-type well so as to extend in said first direction;

an active region formed in said p-type well in each of said plurality of triple well structures, said active region being covered with a tunneling insulation film;

a plurality of buried diffusion regions formed in said Si substrate in the vicinity of each of said triple well structures, each of said buried diffusion regions extending in said first direction and being aligned with each other in said first direction, said buried diffusion regions being further repeated in a second direction different from said first direction;

a plurality of floating gate electrodes each provided on said Si substrate so as to extend over a part thereof located between a buried diffusion region and a neighboring active region so as to achieve a capacitance coupling with said buried diffusion region via an insulation film formed on a surface of said Si substrate, said plurality of diffusion regions extending over said tunneling insulation film on said active region; and a plurality of word lines extending over said Si substrate in a second direction across said plurality of triple well structures and said buried diffusion regions that are repeated in said second direction, each of said word lines making a contact with a buried diffusion region which is crossed with said word line, said floating gate electrode being repeated in said first direction in correspondence to said plurality of buried diffusion regions aligned in said first direction, said floating gate electrode being further repeated in said second direction, said plurality of word lines being repeated in said first direction.

Another object of the present invention is to provide a NAND-type non-volatile semiconductor memory device, comprising:

a p-type Si substrate;

a plurality of triple well structures formed in said p-type Si substrate repeatedly, each of said triple well structures comprising a part of said p-type Si substrate and an n-type well formed in said Si substrate so as to extend in said first direction and a p-type well formed in said n-type well in said first direction;

a pair of active regions formed in each of said plurality of triple well structures in said p-type well, each of said active regions extending in said fist direction and covered with a tunneling oxide film;

a plurality of buried diffusion regions each formed on said Si substrate in the vicinity of one of said triple well structures, each of said buried diffusion regions extending in said first direction and arranged in said first direction in two rows; and a plurality of floating gate electrodes provided on said Si substrate so as to extend between each buried diffusion region and an active region neighboring thereto, each of said floating gate electrodes extending on said active region over said tunneling oxide film and making a capacitance coupling with said buried diffusion region via an insulation film formed on a surface of said Si substrate, said plurality of triple well structures and said two rows of buried diffusion regions forming respectively a first structural unit and a second structural unit repeated over a surface of said Si substrate alternately in a second direction different from said first direction, said non-volatile semiconductor memory device further having a plurality of word lines extending over said Si substrate in said second direction across said plurality of triple well structures and said buried diffusion regions that are repeated in said second direction, each of said word lines making a contact with a buried diffusion region each time said word line crosses a buried diffusion region;

said floating gate electrode being formed repeatedly in said first direction in correspondence to said plurality of buried diffusion regions aligned in said first direction, said plurality of word lines being repeated in said first direction.

According to the present invention, it is no longer necessary to form the select gate for each memory cell in the flash memory device of the single-layer gate structure, and it becomes possible to reduce the memory cell area by about 50%. By integrating such flash memory devices having a reduced cell area with each other, it becomes possible to construct a highly integrated flash-memory integrated circuit device. Furthermore, it becomes possible to reduce the operational voltage at the time of wiring or erasing of the flash memory device. Furthermore, it becomes possible to reduce the cost of constructing a hybrid integrated circuit device in which a flash memory device is integrated together with other devices such as a logic circuit device.

Other objects and further features of the present invention will become apparent from the following detailed description when read in conjunction with the attached drawings.

BRIEF DESCRIPTION OF THE DRAWINGS

FIGS. 1A–1C are diagrams showing the construction of a single-layer gate flash memory device according to a related art of the present invention;

FIGS. 9A and 9B are diagrams showing the construction of the flash memory device of FIG. 8 in a cross-sectional view;

FIGS. 10A and 10B are diagrams explaining the erasing operation of the flash memory device of FIG. 9;

FIGS. 17A and 17B are diagrams explaining the writing operation of the flash memory device of FIG. 16;

DETAILED DESCRIPTION OF THE INVENTION

[First Embodiment]

Figures 2A, 2B:
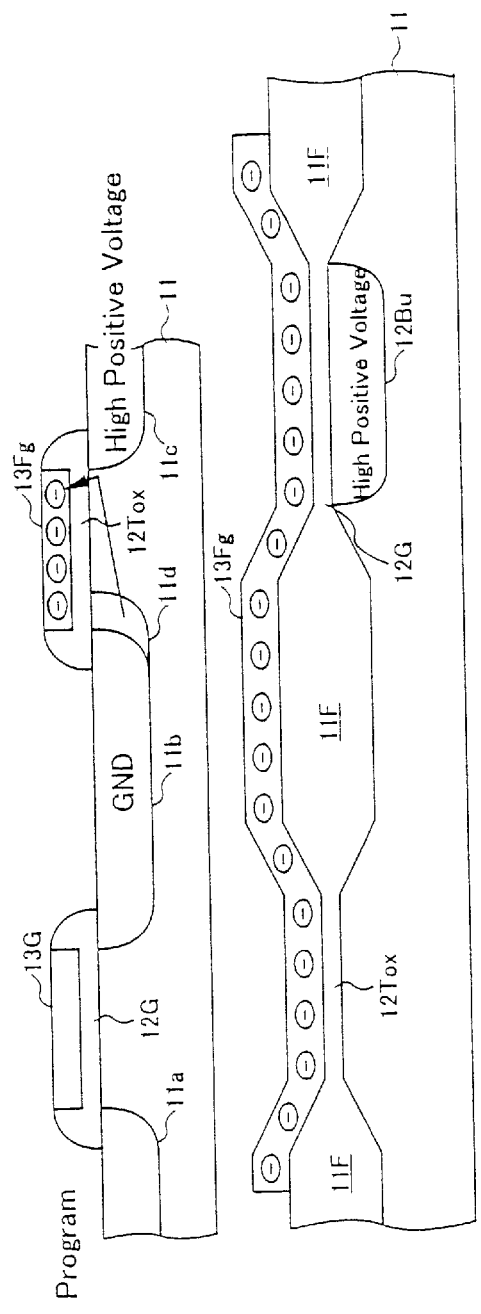
FIGS. 2A and 2B are diagrams explaining the writing operation of the single-layer gate flash memory device of the related art of the present invention.
Figures 3A, 3B:
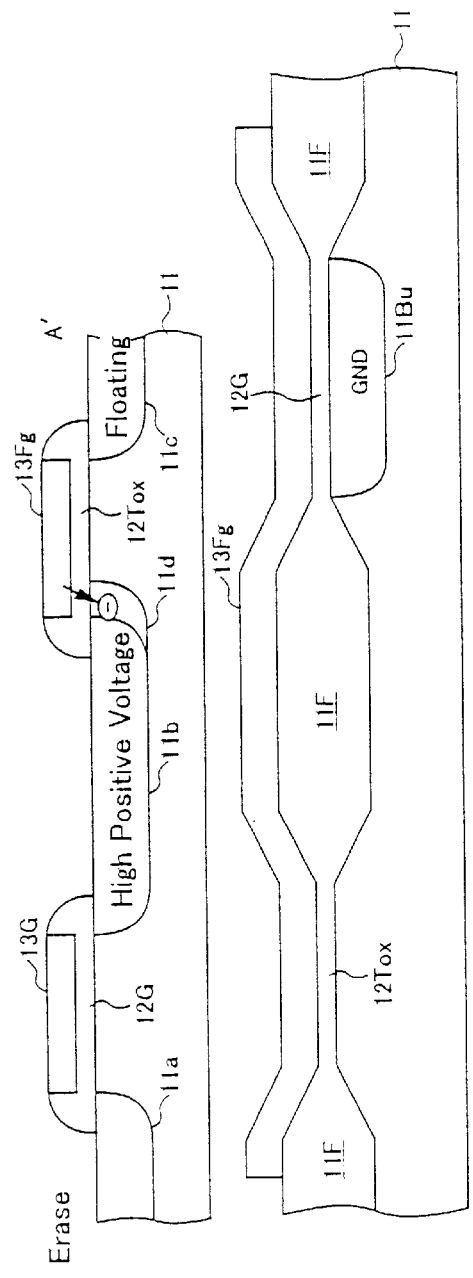
FIGS. 3A and 3B are diagrams explaining the erasing operation of the single-layer gate flash memory device according to the related art of the present invention.
Figure 4:
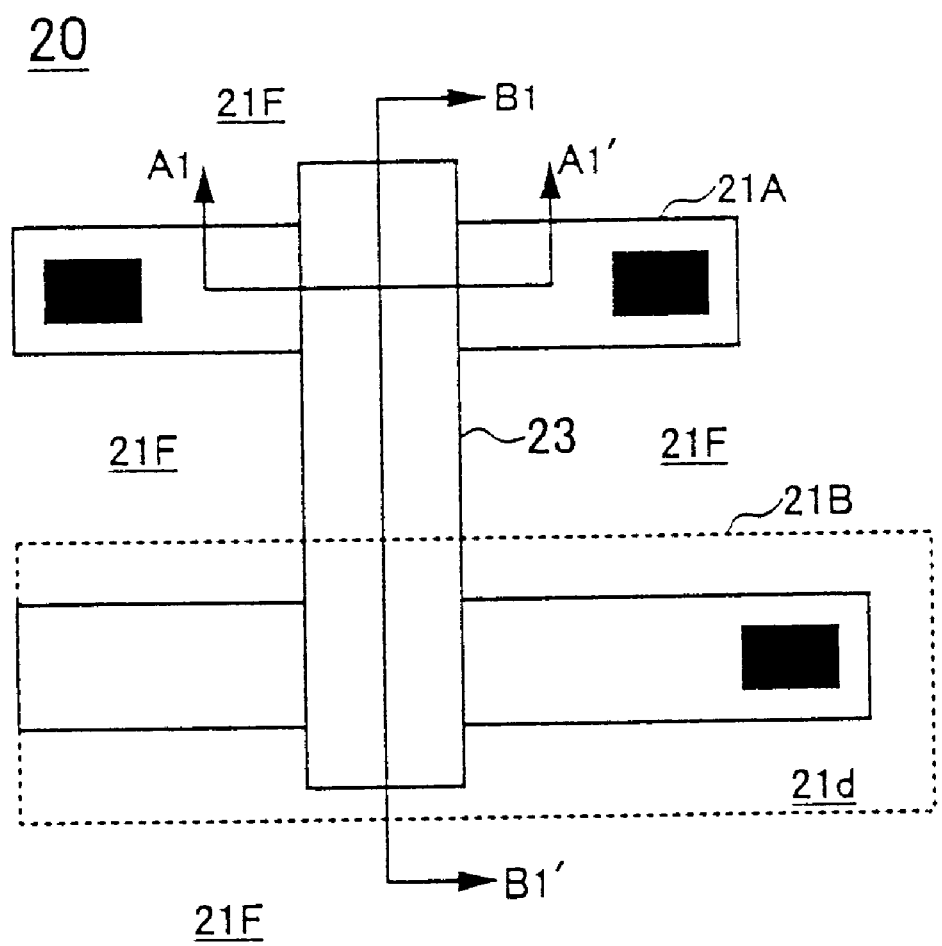
FIG. 4 is a diagram showing the construction of a flash memory device according to a first embodiment of the present invention.
Figure 5A:
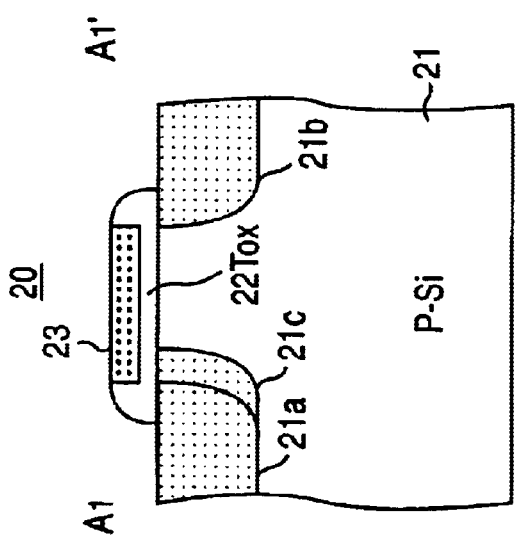
FIGS. 5A and 5B are diagrams showing the cross-sectional view of the flash memory device of FIG. 4.
Figure 5B:
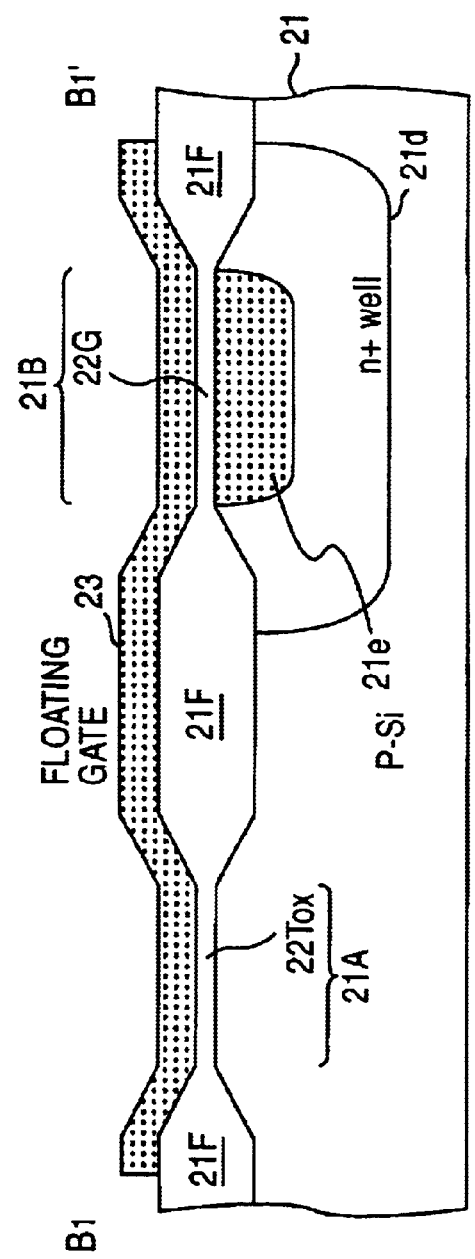

FIG. 4 is a plane view showing the construction of the flash memory device according to a first embodiment of the present invention while FIGS. 5A and 5B show the cross-sectional view of the flash memory device of FIG. 4 taken along the lines A1–A1' and B1–B1' in FIG. 4.

Referring to FIG. 4 and FIGS. 5A and 5B, an active region 21A is defined on a p-type Si-substrate 21 by a field oxide film 21F, and another active region 21B is formed in the vicinity of the active region 21A in a parallel relationship with the active region 21A.

As shown in the cross-sectional view of FIG. 5A, n+-type diffusion regions 21a and 21b are formed in the Si substrate 21 in correspondence to the active region 21A, and a floating gate electrode 23 is formed on the Si substrate 21 in correspondence to the channel region formed between the diffusion regions 21a and 21b, with a tunneling oxide film 22Tox interposed therebetween. In the constitution of FIG. 5A, an n-type LDD region 21c is formed adjacent to the n+-type diffusion region 21a.

As shown in the cross-sectional view of FIG. 5B, the floating gate electrode 23 extends over the field oxide film 21F that defines the active region 21A, wherein the floating gate electrode 23 extends further over the oxide film 22G that covers the surface of the Si substrate 11 in the active region 11B.

In the active region 11B, there is formed a well 21d of n+-type so as to cross the floating gate electrode 23 as shown in the plane view of FIG. 4, and a buried diffusion region 21e of p+-type is formed in the n+-type well 21d so as to cross the floating gate electrode 23 as shown in the plan view of FIG. 4.

Figure 6A:
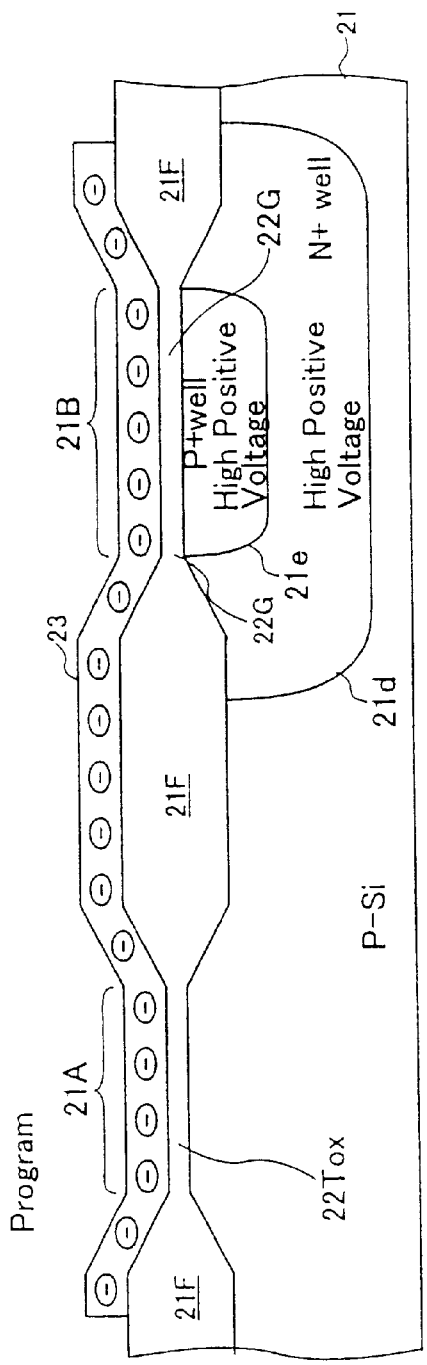
FIGS. 6A and 6B are diagrams explaining the writing operation of the flash memory device of FIG. 4.
Figure 6B:
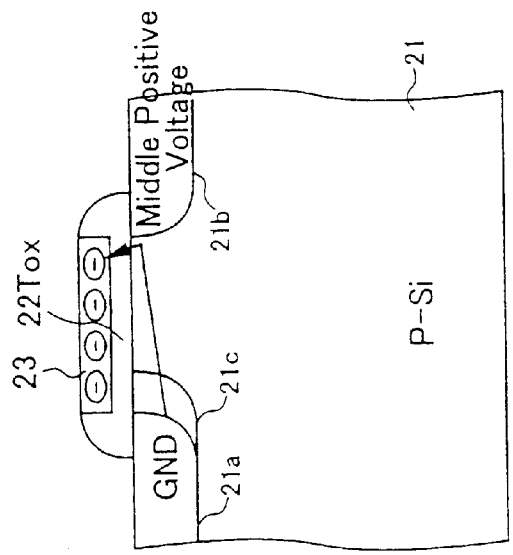

FIGS. 6A and 6B are diagrams that explain the writing operation of the flash memory device 20.

Referring to FIG. 6B, a positive voltage of about +5 volts is applied to the diffusion region 21b in the active region 21A, and a positive writing voltage of +7–+12V is applied to the n+-type well 21d and the p+-type buried diffusion region 21e in the active region 21B as shown in FIG. 6A. Thereby, the hot electrons formed in the vicinity of the diffusion region 21b are injected into the floating gate electrode 23 in the active region 21A through the tunneling oxide film 22Tox.

Under the foregoing condition, it becomes possible to perform writing (program) of information by way of channel hot electron injection.

Figure 7A:
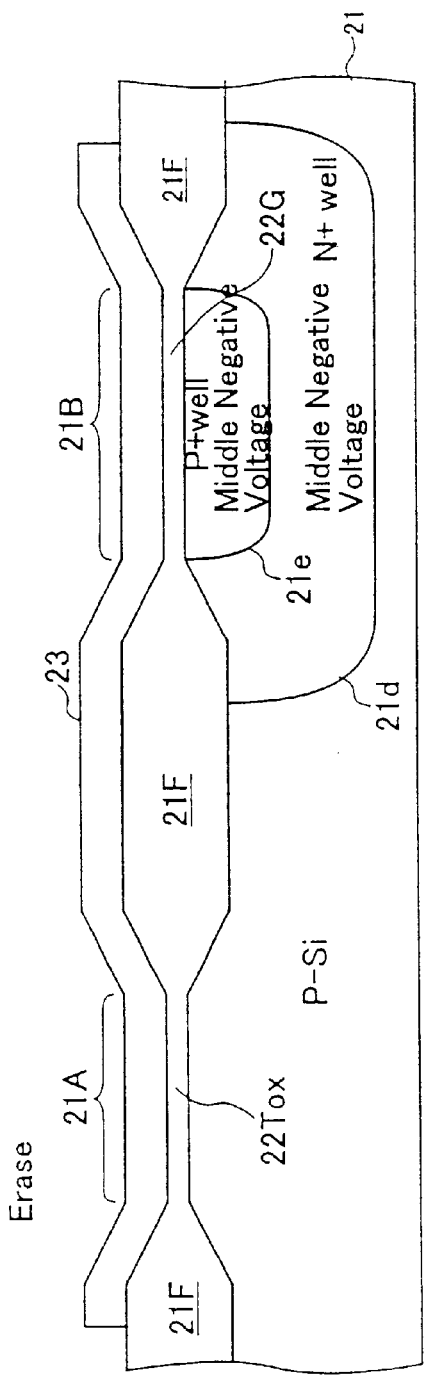
FIGS. 7A and 7B are diagrams explaining the erasing operation of the flash memory device of FIG. 4.
Figure 7B:
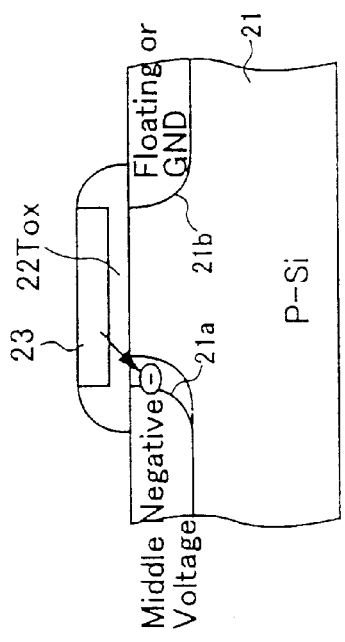

FIGS. 7A and 7B are diagrams that explain the erasing operation of the flash memory device 20.

Referring to FIG. 7B, a positive voltage of about +5 volts is applied to the diffusion regions 21a and 21c at the time of erasing operation and the diffusion region 21b is made to a floating state. Further, as shown in FIG. 7A, a negative erasing voltage of about −10V is applied in this state to the p+-type buried diffusion region 21e in the active region 21B and further to the n+-type well 21d. As a result, the electrons accumulated in the floating gate electrode 23 are discharged to the diffusion region 21c and 221a as a result of Fowler-Nordheim-type tunneling effect.

Under the foregoing condition, erasing of information by way of Fowler-Nordheim tunneling effect becomes possible.

Further, reading of information becomes possible by applying a voltage of 5V to the p+-type buried diffusion region 21e and a voltage of 1V to the diffusion region 21b.

Thus, in the flash memory device of this embodiment, it becomes possible to omit the select-gate electrode 13G used in the flash memory device 10 of the related art explained previously, due to the use of the single-layer gate structure, and the cell area is reduced. Further, it becomes possible to construct a large scale integrated circuit having a large integration density together with the transistors constituting other high-speed logic circuits. Furthermore, it becomes possible to reduce the voltage at the time of erasing and writing operations.

[Second Embodiment]

Figure 8:
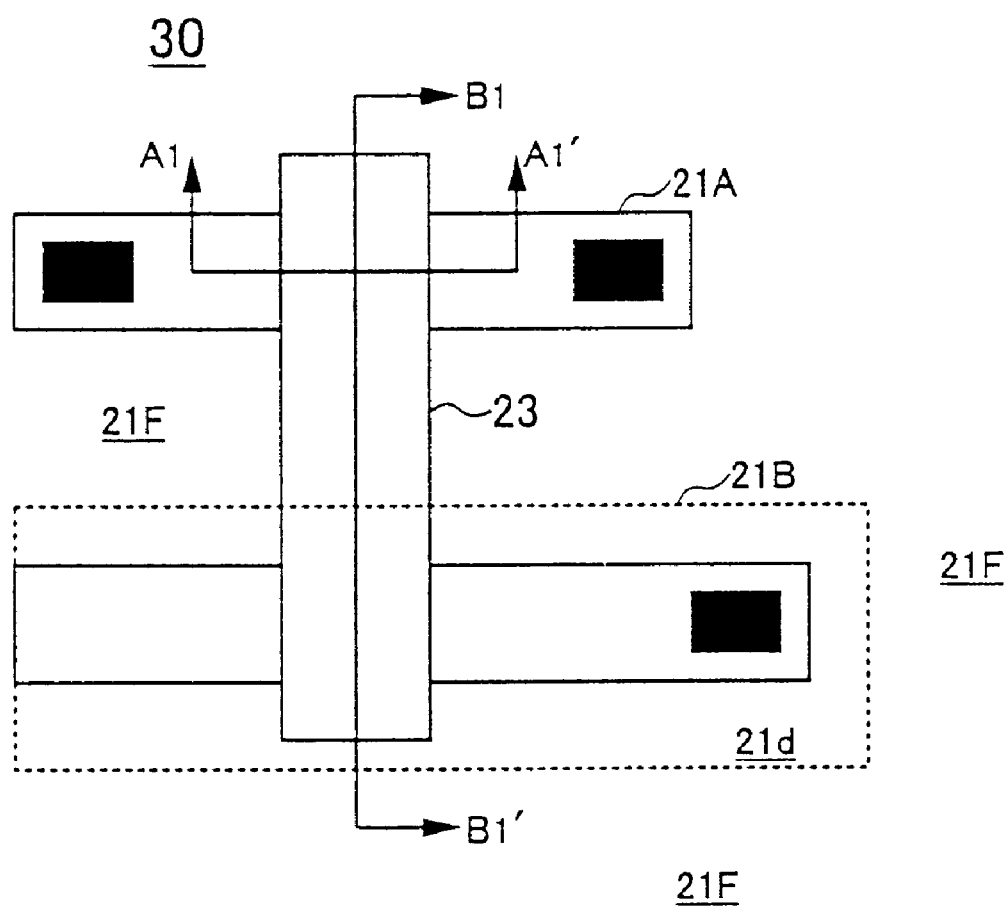
FIG. 8 is a diagram showing the construction of a flash memory device according to a second embodiment of the present invention in a plan view.

FIG. 8 shows the construction of a flash memory device 30 according to a second embodiment of the present invention in a plan view, while FIGS. 9A and 9B show the cross-sectional view of the flash memory device 30 respectively taken along the line A1–A1' and line B1–B1' of FIG. 8. In the drawings, those parts corresponding to the parts explained previously are designated by the same reference numerals and the description thereof will be omitted.

Referring to FIG. 8, the Flash memory device has a construction similar to the flash memory device 20 of the previous embodiment except that it can be seen that the width of the floating gate electrode 23 is reduced as compared with the device of the previous embodiment.

In the flash memory device 30 of FIG. 8, the writing operation is carried out similarly to the previous embodiment explained with reference to FIGS. 6A and 6B. On the other hand, the erasing operation is carried out by applying a large negative voltage of about −15V to the n+-type wells 21d and 21e as shown in FIG. 10A. As a result, the electrons accumulated in the floating gate electrode 23 are discharged to the Si substrate 21 through the tunneling oxide film 22Tox in the active region 21A as a result of the Fowler-Nordheim-type tunneling effect. Thereby, it should be noted that the diffusion regions 21a and 21b are set to the floating state in the active region 21A as shown in FIG. 10B.

Similarly to the first embodiment, it becomes possible to perform writing of information by injection of channel hot electrons. Further, it becomes possible to perform erasing of information by the Fowler-Nordheim tunneling effect. When reading information, a voltage of 5V is applied to the p+-type buried diffusion region 21e and a voltage of 1V to the diffusion region 21b.

In the flash memory device 30, it should be noted that the electrons are pulled out to the Si substrate 21A at the time of erasing operation as shown in FIGS. 10A and 10B. Thus, it becomes possible to omit the LDD region 21c that was formed adjacent to the diffusion region 21a in flash memory device 20 of the previous embodiment. Further, it becomes possible to reduce the distance between the diffusion region 21a and the diffusion region 21b in the active region 21A. Associated with this, it becomes possible to reduce the width of the floating gate electrode 23.

By reducing the width of the floating gate electrode 23 in the flash memory device 30 of this embodiment, it becomes possible to reduce the area of the flash memory cell.

[Third Embodiment]

Figure 11:
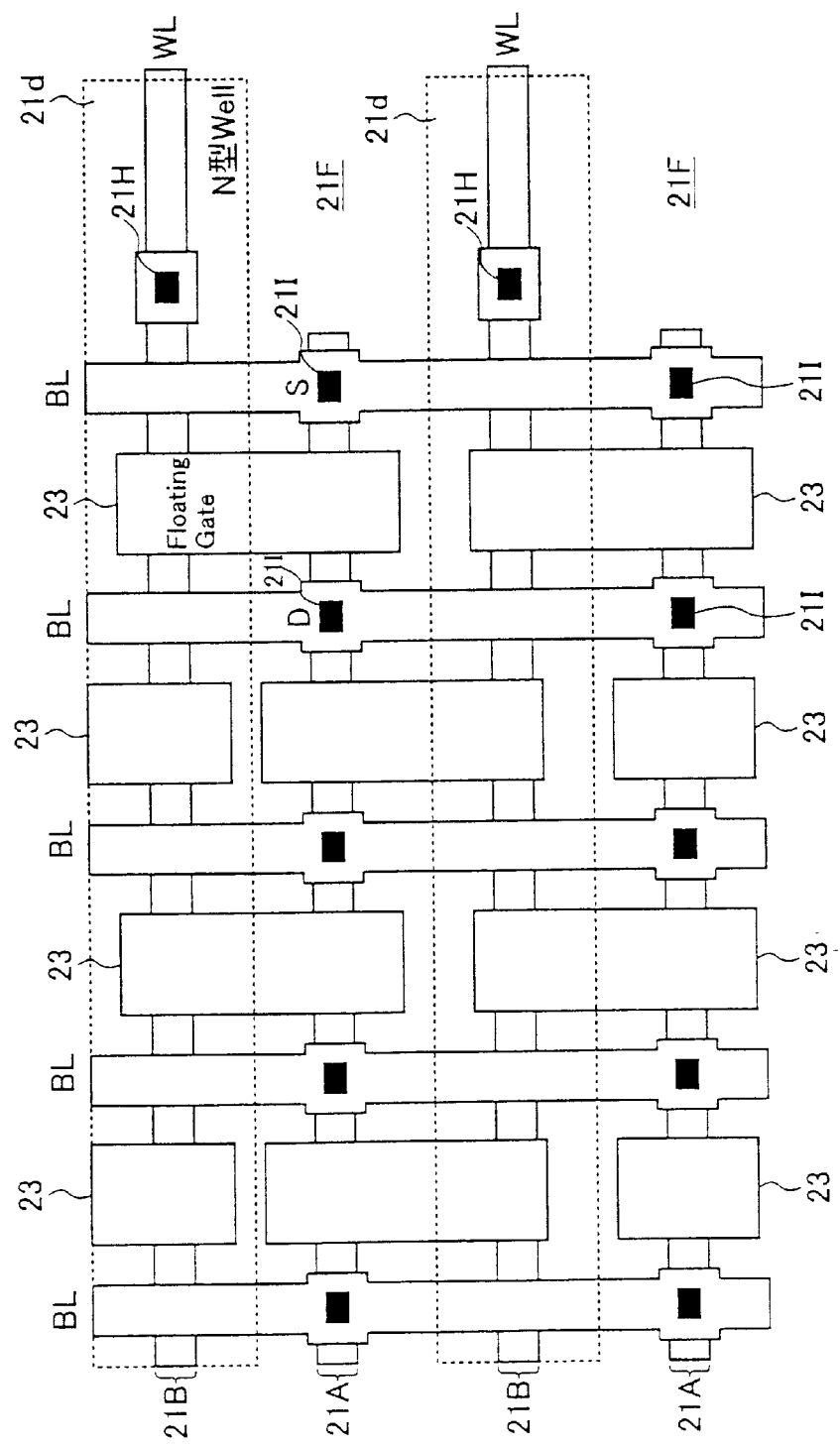
FIG. 11 is a diagram showing the layout of a flash-memory integrated circuit according to a third embodiment of the present invention.

FIG. 11 is a diagram showing the layout of the memory integrated circuit device that uses the flash memory device 20 of FIG. 4 or the flash memory device 30 of FIG. 8.

Referring to FIG. 11, the active region 21A and the active region 21B are formed on the surface of the Si substrate 11 so as to be repeated alternately, and word lines WL are formed so as to extend in correspondence to the active regions 21B. Thereby, each of the word lines WL makes a contact to the buried diffusion region 21e at a contact hole 21H formed in an interlayer insulation film of which representation is omitted. Furthermore, a number of bit lines BL are formed so as to extend across the diffusion regions 21A and 21B, wherein each of the bit lines is caused to make a contact to the diffusion region 21a or the diffusion region 21b in the active region 21A via a contact hole 21I.

Figure 12:
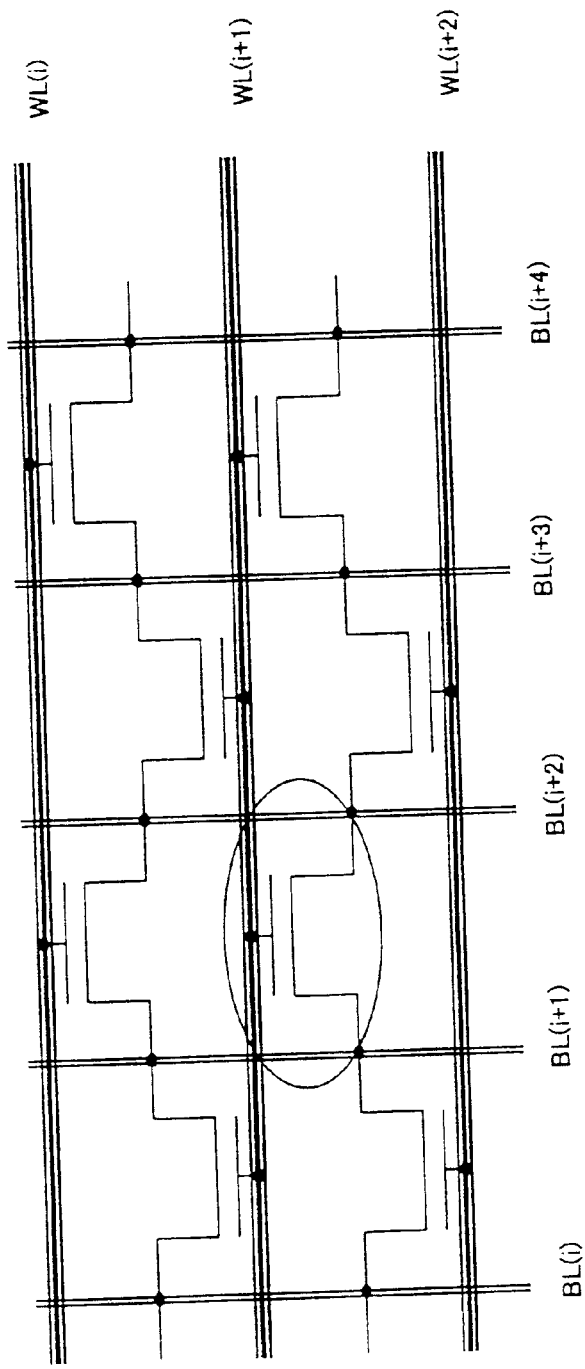
FIG. 12 is a circuit diagram showing the circuit construction of the flash-memory integrated circuit of FIG. 11.

FIG. 12 shows the circuit diagram of the flash-memory integrated circuit of FIG. 11.

Referring to FIG. 12, it can be seen that the flash-memory integrated circuit of this embodiment forms a NOR-type circuit.

The following Table 1 summarizes an example of driving conditions for each of the writing operation, erasing operation and the reading operation of the NOR-type flash memory integrated circuit device of FIG. 12, wherein it should be noted that Table 1 shows the writing, erasing and reading operations for the flash memory cell (i+1) marked up by a circle in FIG. 12. In the flash memory cell (i+1), it should be noted that the buried electrode 21e is connected to the word line WL(i+1) and the diffusion region 21a is connected to the bit line BL(i+1). Furthermore, the diffusion region 21c is connected to the adjacent bit line BL(i+2).

TABLE 1

| program | BL(I) | Float | Erase1 | BL(i) | Float | Read | BL(I) | Float |
|---|---|---|---|---|---|---|---|---|
| | BL(I + 1) | 0V | | BL(I + 1) | 5V | | BL(I + 1) | 0V |
| | BL(I + 2) | 5V | | BL(I + 2) | Float | | BL(I + 2) | 1V |
| | BL(I + 3) | Float | | BL(I + 3) | 5V | | BL(I + 3) | Float |
| | BL(I + 4) | Float | | BL(I + 4) | Float | | BL(I + 4) | Float |
| | WL(I) | 0V | | WL(i) | −10V | | WL(I) | 0V |
| | WL(I + 1) | 10V | | WL(I + 1) | −10V | | WL(I + 1) | 5V |
| | WL(I + 2) | 0V | | WL(I + 2) | −10V | | WL(I + 2) | 0V |
| | | | Eerase2 | BL(I) | Float | | | |
| | | | | BL(I + 1) | Float | | | |
| | | | | BL(I + 2) | Float | | | |

TABLE 1-continued

| program | BL(I) | Float | Erase1 | BL(i) | Float | Read | BL(I) | Float |
|---------|-------|-------|--------|-------|-------|------|-------|-------|
|         |       |       |        | BL(I + 3) | Float |      |       |       |
|         |       |       |        | BL(I + 4) | Float |      |       |       |
|         |       |       |        | WL(I) | −15V |      |       |       |
|         |       |       |        | WL(I + 1) | −15V |      |       |       |
|         |       |       |        | WL(I + 2) | −15V |      |       |       |

Table 1 is referred to.

At the time of writing, the bit lines BL(i+1) and BL(i+2) are selected and the bit line BL(i+1) is grounded. Further, a positive voltage of +5V is applied to the adjacent bit line BL(i+2) and other non-selected bit lines BL(i+3) and BL(i+4) are made to a floating state, and a writing voltage of +10V is applied to the selected word line WL(i+1) while grounding the non-selected word lines WL(i) and WL(i+2).

As a result, the writing voltage is applied to the buried diffusion region 21e as explained previously, and the hot electrons formed in the vicinity of diffusion region 21b are injected into the floating gate electrode 23 through tunneling oxide film 22Tox.

In Table 1, it should be noted that "Erase 1" represents the erasing operation in which the electric charges are pulled out from the floating gate electrode 23 of the flash memory device (i+1) to the diffusion region 21a, as explained with reference to FIGS. 7A and 7B. In the erasing operation of "Erase 1", the diffusion region 21a is supplied with the drive voltage of +5V from the bit line BL(i+1) and an erasing voltage of −10V is supplied to the floating gate electrode 23 from the word line WL(i+1). Further, in the erasing operation according of "Erase 1", the bit line BL(i+1) adjacent to the selected bit line BL(i+2) is made to the floating state.

In a flash-memory integrated circuit, such an erasing operation is achieved simultaneously also in other flash memory cells. Thus, the drive voltage of +5V is applied to other bit lines such as the bit line BL(i+3) with every one interval. The remaining bit lines, such as the bit line BL(i) or the bit line BL(i+4), are made to the floating state. Further, the erasing voltage of −10V is applied uniformly to all of the word lines, for example the word lines WL(i) and WL(i+2).

In Table 1, "Erase 2" shows the condition of the erasing operation in which the electric charges are pulled out from the floating gate electrode 23 of the flash memory device (i+1) to the Si substrate 21 as explained with reference to FIGS. 10A and 10B. In the erasing operation according to "Erase 2", the bit lines BL(i)–BL(i+4) are made to the floating state and all the word lines WL(i)–WL(i+2) are applied with the erasing voltage of −15V.

When reading out information from the memory cell (i+1), the word line WL(i+1) corresponding to the memory cell (i+1) is selected and a reading voltage of +5V is applied thereto as represented in "Rread" of Table 1. Further, the other word lines WL(i) and WL(i+2) are grounded. Furthermore, the bit lines BL(i+1) and BL(i+2) corresponding to the memory cell (i+1) are selected and the bit line BL(i+1) is grounded while a drive voltage of +5V is applied to the bit line BL(i+2). The remaining bit lines BL(i), BL(i+3) and BL (i+4) are made to a floating state. With this, conduction or unconduction of the selected memory cell is detected by detecting the voltage appearing across the selected bit line pair and the desired reading of information is achieved.

Figure 13:
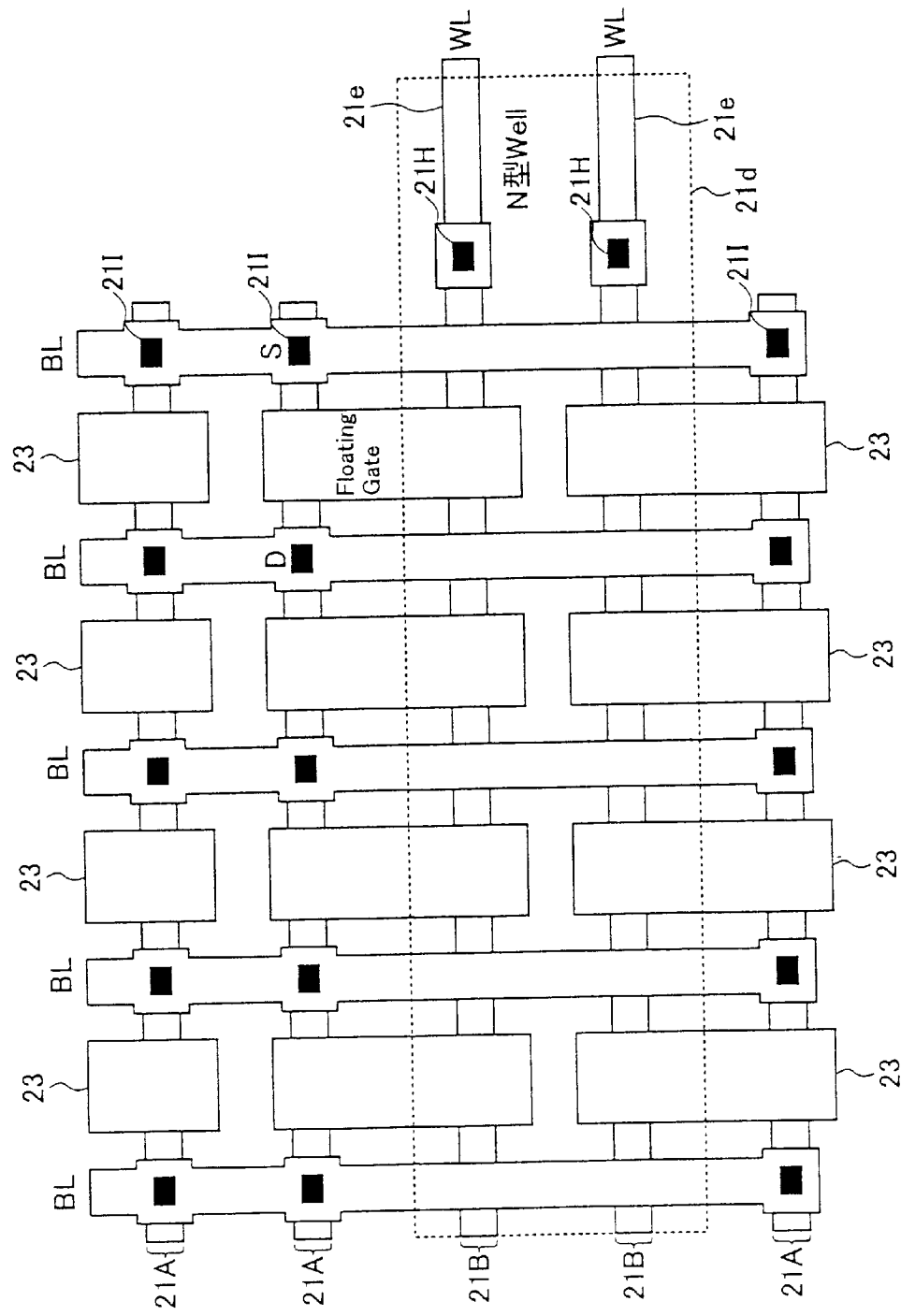
FIG. 13 is a diagram showing the layout of a modification of the flash-memory integrated circuit of FIG. 11.

FIG. 13 shows the layout of a flash-memory integrated circuit according to a modification of the present embodiment. In FIG. 13, those parts corresponding to the parts explained previously are designated with the same reference numerals and the explanation thereof will be omitted.

Referring to FIG. 13, a first structural unit is formed in the present modification from two adjacent active regions 21A and 21A and a second structural unit is formed also of two adjacent buried diffusion region 21e and 21e, and the first and second structural units are repeated alternately. Thereby, the two adjacent buried diffusion regions 21e are formed commonly in the n+-type well 21d.

Figure 14:
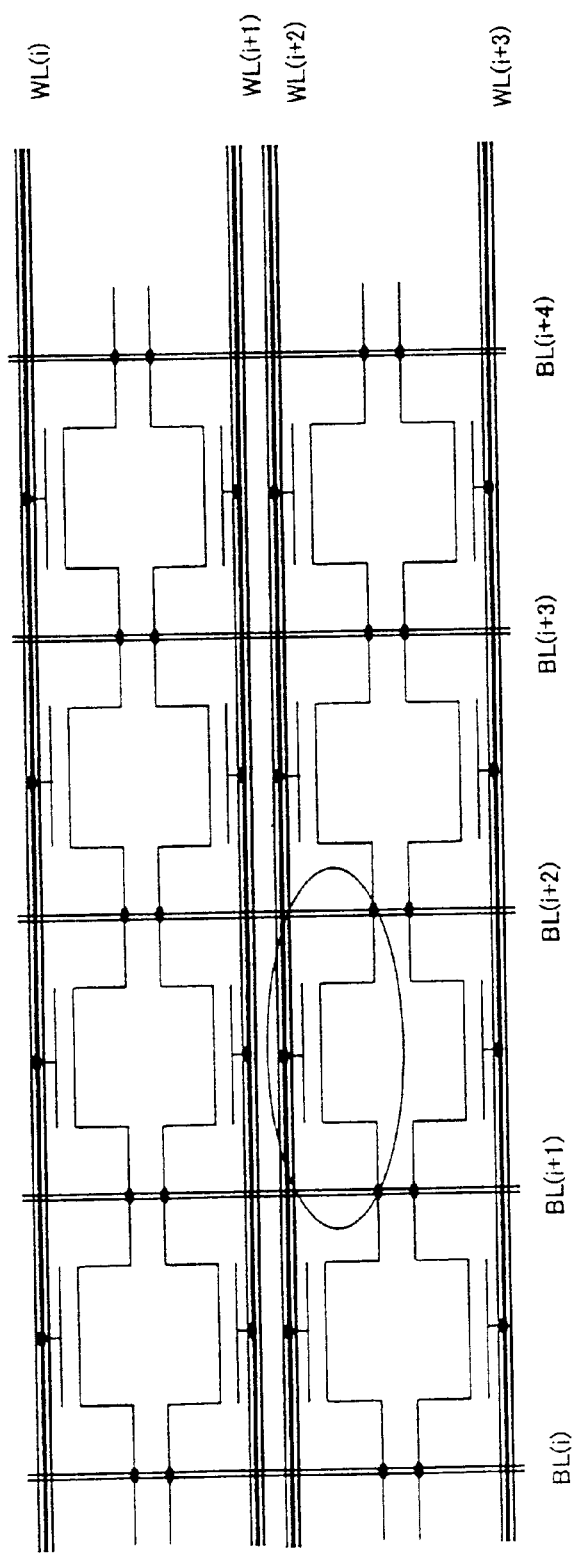
FIG. 14 is a circuit diagram showing the constitution of the flash-memory integrated circuit of FIG. 13.

FIG. 14 shows the circuit diagram of the flash-memory integrated circuit of FIG. 13.

Referring to FIG. 14, a pair of transistor arrays are formed between a pair of adjacent the word lines such as the word line WL (i) and the word line WL (i+1) in the present modification. With this, it can be seen that the integration density is improved slightly in the flash-memory integrated circuit of FIG. 13 over the flash-memory integrated circuit of FIG. 11.

As the operation of the circuit of FIG. 14 is substantially the same with the one explained previously with reference to Table 1, further explanation thereof will be omitted.

[Fourth Embodiment]

Figure 15:
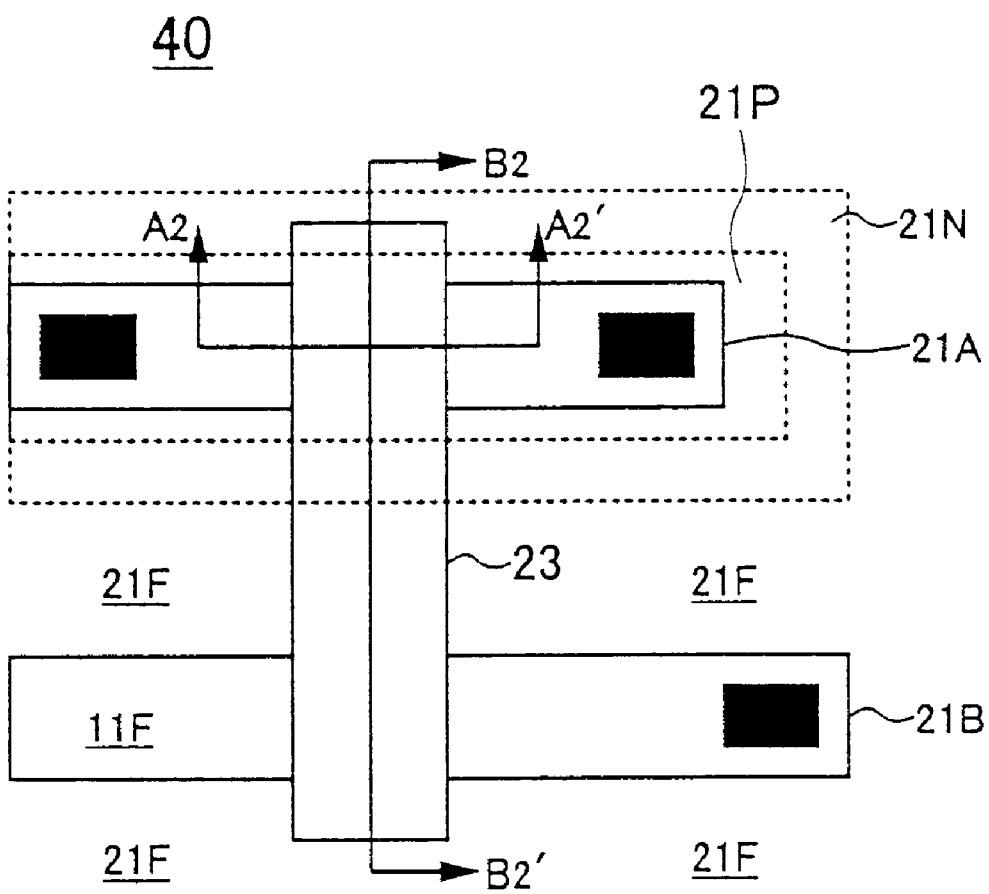
FIG. 15 is a diagram showing the construction of a flash memory device according to a fourth embodiment of the present invention in a plan view.
Figure 16A:
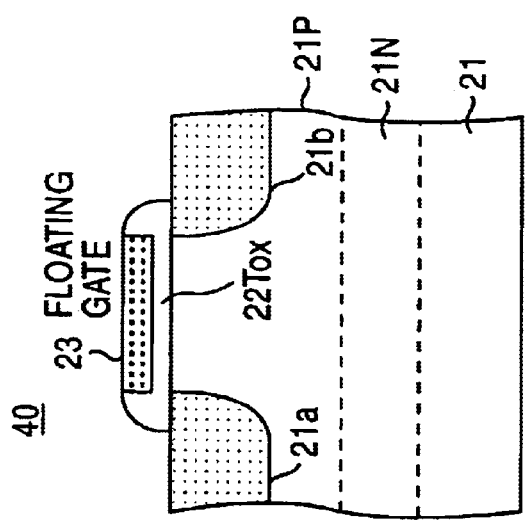
FIGS. 16A and 16B are diagrams showing the constitution of the flash memory device of FIG. 15 in a cross-sectional view.
Figure 16B:
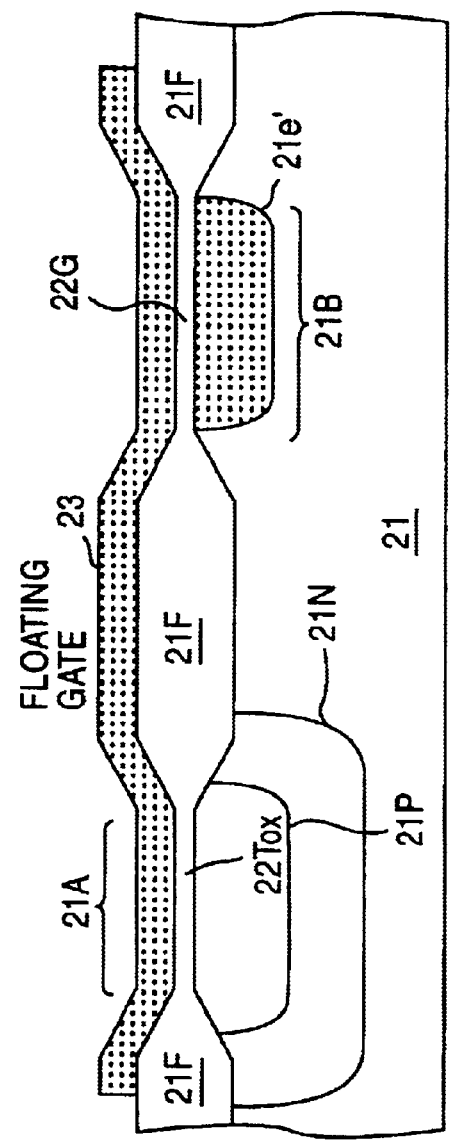

FIG. 15 shows the construction of a flash memory device 40 according to a fourth embodiment of the present invention in a plane view, while FIGS. 16A and 16B show the flash memory device 40 in a cross-sectional view taken respectively along lines A2–A2' and B2–B2' of FIG. 15. In the drawings, those parts corresponding to the parts explained previously are designated with the same reference numerals and the description thereof will be omitted.

Referring to FIG. 15 and further to FIGS. 16A and 16B, it can be seen that an n-type well 21N is formed in the Si substrate 21 in correspondence to the active region 21A in this embodiment, and a p-type well 21P is formed in the n-type well 21N. On the other hand, the n+-type well 21d used in the previous embodiment is removed from the active region 21B. Further, a buried diffusion region 21e' of n+-type is formed.

Next, the writing operation of the flash memory device 40 will be explained with reference to FIGS. 17A and 17B.

Referring to FIGS. 17A and 17B, the n-type well 21N and the p-type well 21P in the active region 21A are grounded at the time of writing operation, and the diffusion region 21a is grounded also in this state. Further, a drive voltage of about +5 volts is applied to the diffusion region 21b and a writing voltage of +10V is applied to the buried diffusion region 21e' in the active region 21B simultaneously. As a result, the hot electrons formed in the p-type well 21P in the vicinity of the diffusion region 21b are injected into the floating gate electrode 23 through the tunneling oxide film 22Tox.

Figure 18A:
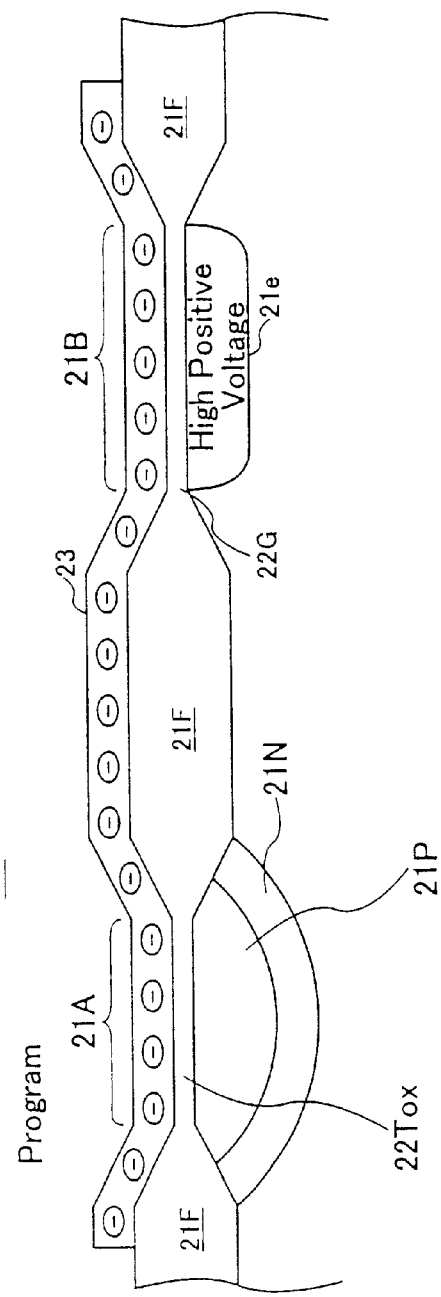
FIGS. 18A and 18B are diagrams explaining a different writing operation of the flash memory device of FIG. 16.
Figure 18B:
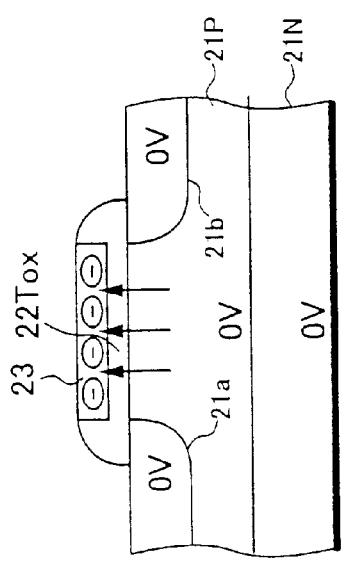

FIGS. 18A and 18B show a different writing operation of the flash memory device 40.

Referring to FIGS. 18A and 18B, the n-type well 21N and the p-type well 21P in the active region 21A are set to 0V at the time of the writing operation, and a writing voltage of +20V is applied simultaneously to the buried diffusion layer 21e in the active region 21B. As a result, hot electrons are injected into the floating gate electrode 23 from the p-type well 21P through the tunneling oxide film 22Tox by the Fowler-Nordheim-type tunneling effect.

FIGS. 18A and 18B show the erasing operation of the flash memory device 40.

Referring to FIGS. 18A and 18B, a positive voltage of about +15 V is applied to the n-type well 21N and the p-type well 21P in the active region 21A, and the buried diffusion region 21e' in the active region 21B is grounded. As a result, the electrons in the floating gate electrode 23 are pulled out to the p-type well 21P through the tunneling insulation film 22Tox by the Fowler-Nordheim-type tunneling effect.

Under the foregoing condition, it becomes possible to carry out writing and erasing (program) of information based on the Fowler-Nordheim tunneling effect. Further, reading of information becomes possible by applying a voltage of 5V to the buried diffusion region 21e' and a voltage of 1V to the diffusion region 21b.

[Fifth Embodiment]

Figure 19A:
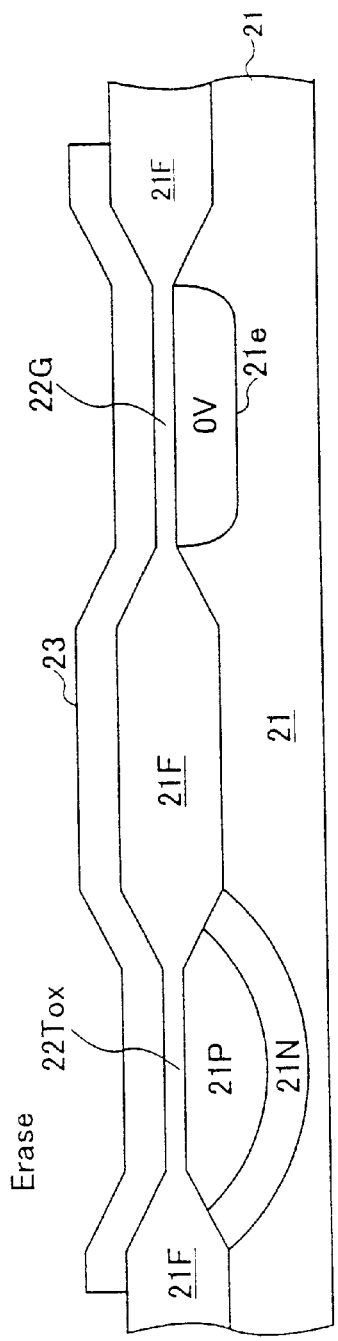
FIGS. 19A and 19B are diagrams explaining the erasing operation of the flash memory device of FIG. 16.
Figure 19B:
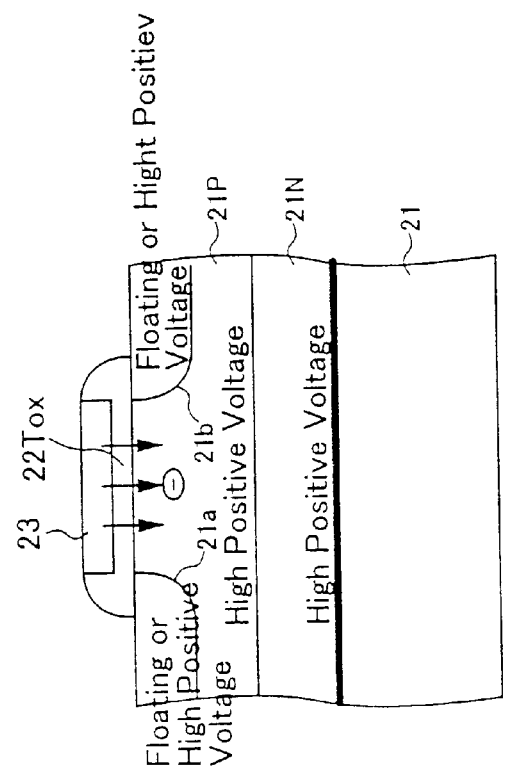
Figure 20:
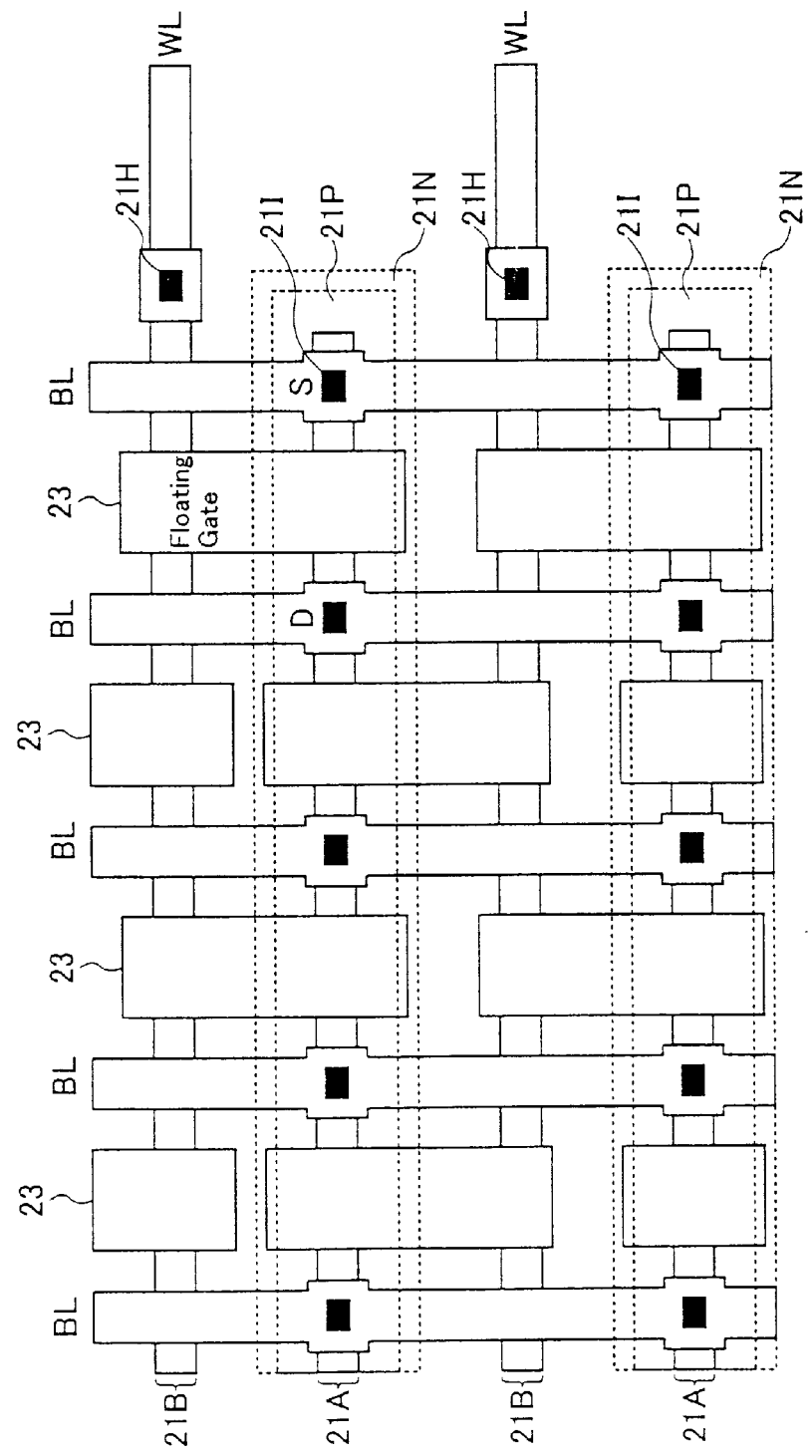
FIG. 20 is a diagram showing the layout of a flash-memory integrated circuit according to a fifth embodiment of the present invention.
Figure 21:
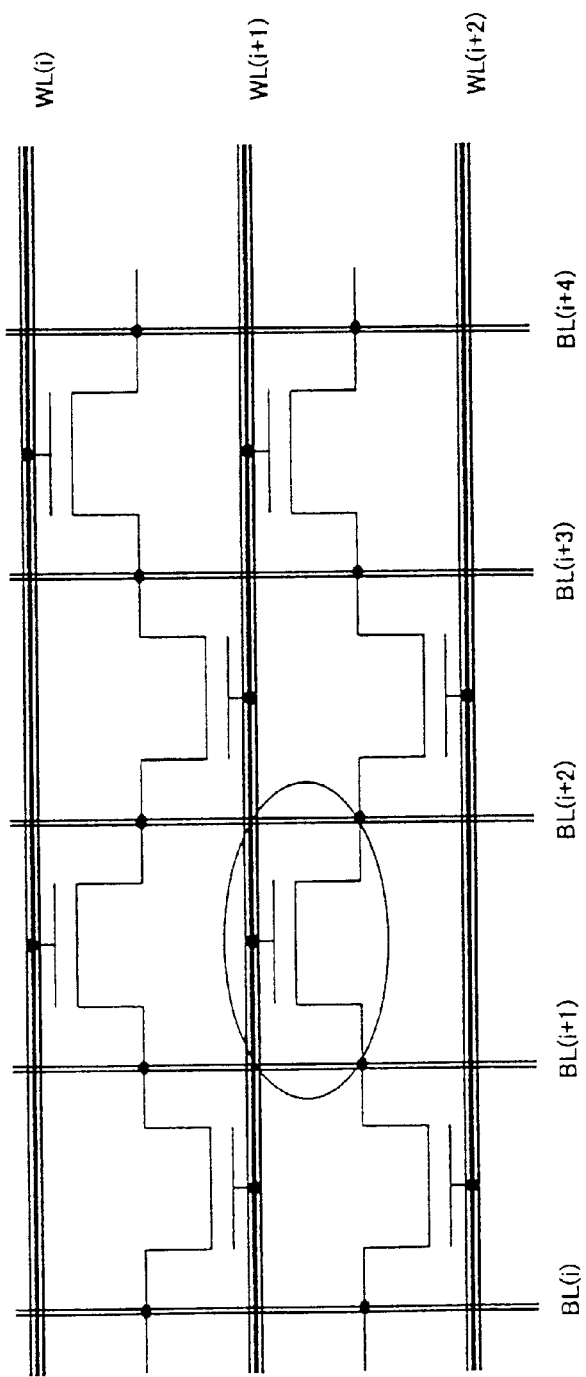
FIG. 21 is a circuit diagram showing the circuit construction of the flash-memory integrated circuit of FIG. 20.

FIG. 20 is a diagram showing the layout of a flash-memory integrated circuit according to a fifth embodiment of the present invention, wherein the flash-memory integrated circuit is constructed by the flash memory device 40 explained previously. Further, FIG. 21 shows the circuit diagram corresponding to FIG. 19. In the drawings, those parts explained previously are designated with the same reference numerals and description thereof will be omitted.

Referring to FIG. 20, the layout of the integrated circuit device of the present embodiment is similar to the one explained previously with reference to FIG. 11, except that the n+-type well 21d in the active region 21B of FIG. 11 is removed. In place of the well 21d, it can be seen that a dual well structure including the well 21N and the well 21P is formed in the active region 21A.

Next, the operation of the flash memory device 40 of FIG. 20 will be explained for writing, erasing and reading operations with regard to the flash memory cell (i+1), which is marked up by circle in the FIG. 21, while referencing to Table 2.

corresponding to the selected flash memory cell, and the hot electrons thus formed are injected into the floating gate electrode 23.

At the time of the erasing operation, on the other hand, the erasing voltage of +15V is applied to the p-type well 21P and the n-type well 21N, and all the bit lines BL(i)–BL(i+4) are set to the floating state. Further, all the word lines WL(i) –WL(i+2) are grounded. As a result, the electrons in the floating gate electrode 23 are pulled out to the corresponding p-type well 21P in all of the memory cells and there takes place a flash-erase operation, which is pertinent to a flash memory device.

At the time of the reading operation, a read voltage of 5V is applied to the word line WL(i+1) of the selected memory cell (i+1), and other word lines WL(i) and WL(i+2) are grounded. Furthermore, the bit line BL(i+1) corresponding to the selected memory cell (i+1) is grounded, and the drive voltage of +5V is applied to the bit line BL(i+2). Other bit lines BL(i), BL(i+3) and BL(i+4) are made to the floating state.

According to this embodiment, it is no longer unnecessary to apply a negative voltage at the time of erasing operation, unlike the operation of Table 1 explained previously, and it becomes possible to simplify construction of the power supply system of the flash memory device.

Figure 22:
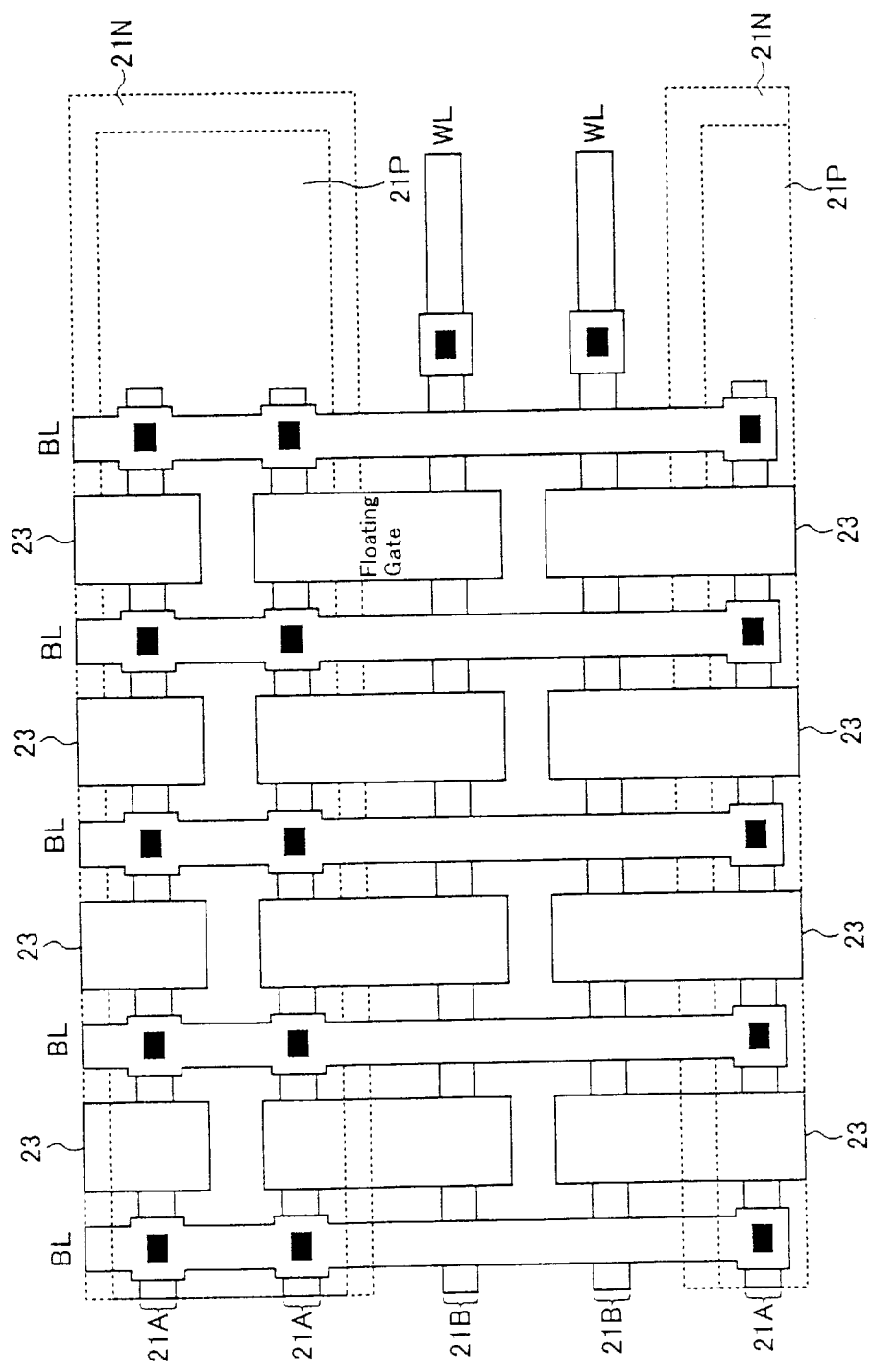
FIG. 22 is a diagram showing the layout of a modification of the flash-memory integrated circuit of FIG. 20.
Figure 23:
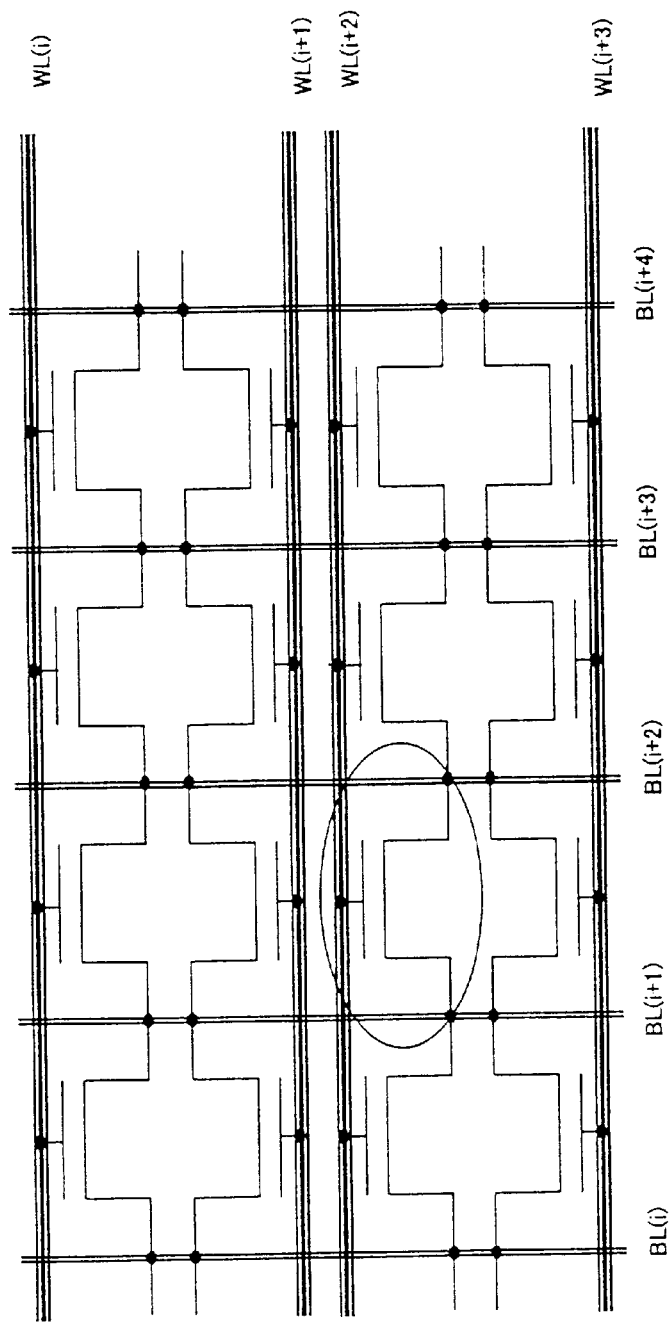
FIG. 23 is a circuit diagram showing the construction of the flash-memory integrated circuit of FIG. 22

FIG. 22 shows the layout of the flash-memory integrated circuit according to a modification of the present embodiment, while FIG. 23 shows the circuit diagram of the apparatus of FIG. 22. In the drawings, those parts corresponding to the parts explained previously are designated by the same reference numerals and description thereof will be omitted.

Referring to FIG. 22, it can be seen that the flash-memory integrated circuit of the present modification has a layout in which a first structural unit formed of a pair of mutually adjacent active regions 21A and a second structural unit formed of a pair of mutually adjacent active regions 21B are

TABLE 2

| program | BL(I) | FLOAT | Erase | BL(I) | FLOAT | READ | BL(I) | FLOAT |
|---|---|---|---|---|---|---|---|---|
| | BL(I + 1) | 0V | | BL(I + 1) | FLOAT | | BL(I + 1) | 0V |
| | BL(I + 2) | 5V | | BL(I + 2) | FLOAT | | BL(I + 2) | 1V |
| | BL(I + 3) | FLOAT | | BL(I + 3) | FLOAT | | BL(I + 3) | FLOAT |
| | BL(I + 4) | FLOAT | | BL(I + 4) | FLOAT | | BL(I + 4) | FLOAT |
| | WL(I) | 0V | | WL(I) | 0V | | WL(I) | 0V |
| | WL(I + 1) | 0V | | WL(I + 1) | 0V | | WL(I + 1) | 0V |
| | WL(I + 2) | 10V | | WL(I + 2) | 0V | | WL(I + 2) | 5V |
| | WL(I + 3) | 0V | | p-well | 15V | | WL(I + 3) | 0V |
| | | | | n-well | 15V | | | |

Table 2 is referred to as an example.

At the time of the writing operation, the bit lines BL(i+1) and BL(i+2) are selected similarly to the case of Table 1 and the bit line BL(i+1) is grounded. Further, a drive voltage of +5V is applied the bit line BL(i+2) while the non-selected bit lines BL(i), BL (i+3) and BL(i+4) are set to floating state. In this state, the word line WL (i+1) is selected and a writing voltage of +10V is applied thereto, while the non-selected word lines such as the word lines WL(i) and WL(i+2) are grounded. As a result, hot electrons are formed in the vicinity of the diffusion region 21b in the active region 21A repeated on the Si substrate. Also it can be seen that the mutually adjacent active regions 21A and 21A are formed commonly in the p-type well 21P. As a result, it becomes possible to improve the integration density in the construction of FIG. 22 as compared with the construction of FIG. 20.

As can be seen in the circuit diagram of FIG. 23, the flash-memory integrated circuit of this embodiment also has the construction of NOR-type. As the driving conditions of the circuit of FIG. 23 are similar to the one explained previously with reference to Table 2, further description thereof will be omitted.

[Sixth Embodiment]

Figure 24:
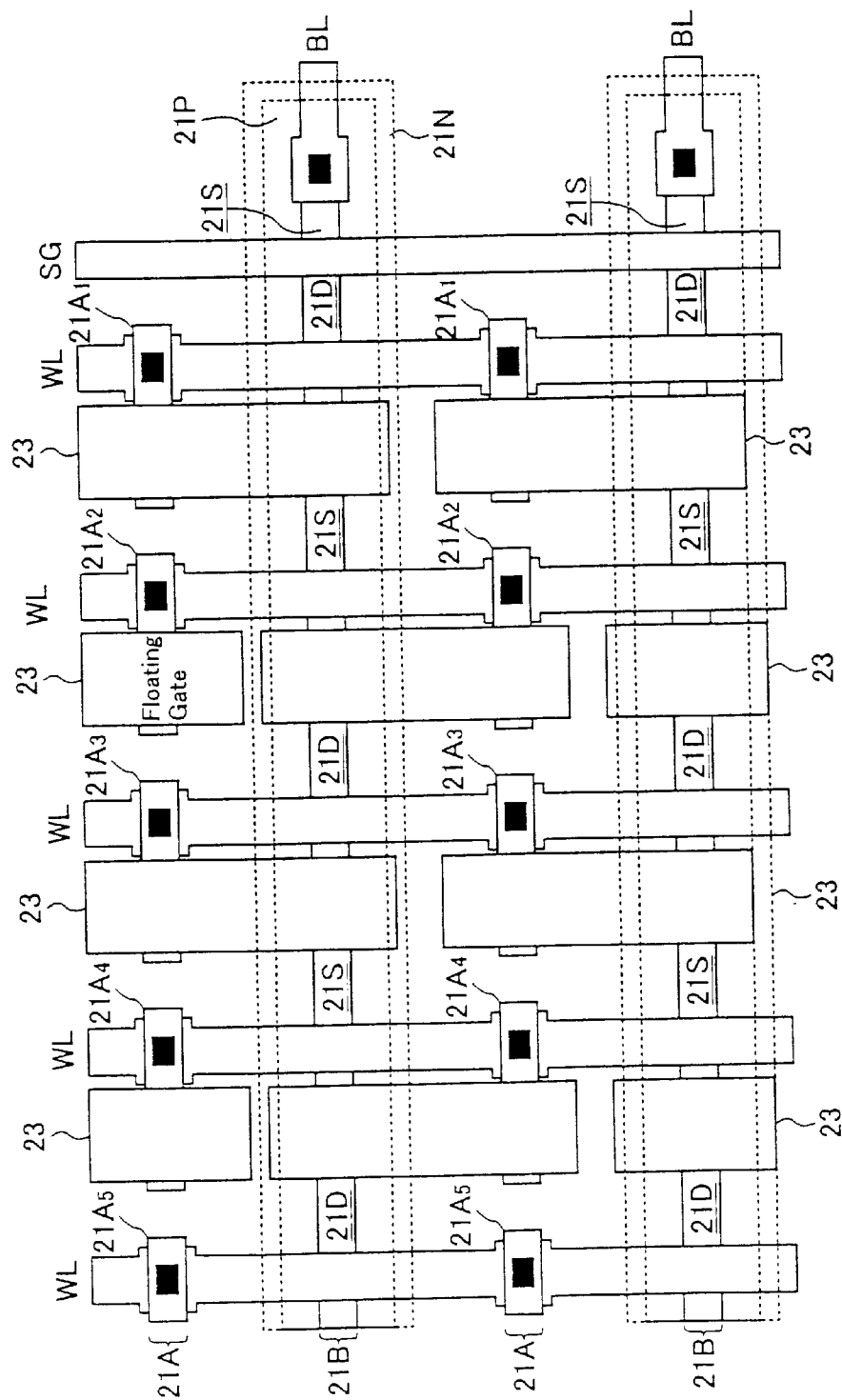
FIG. 24 is a diagram showing the layout of a flash-memory integrated circuit according to a sixth embodiment of the present invention.
Figure 25:
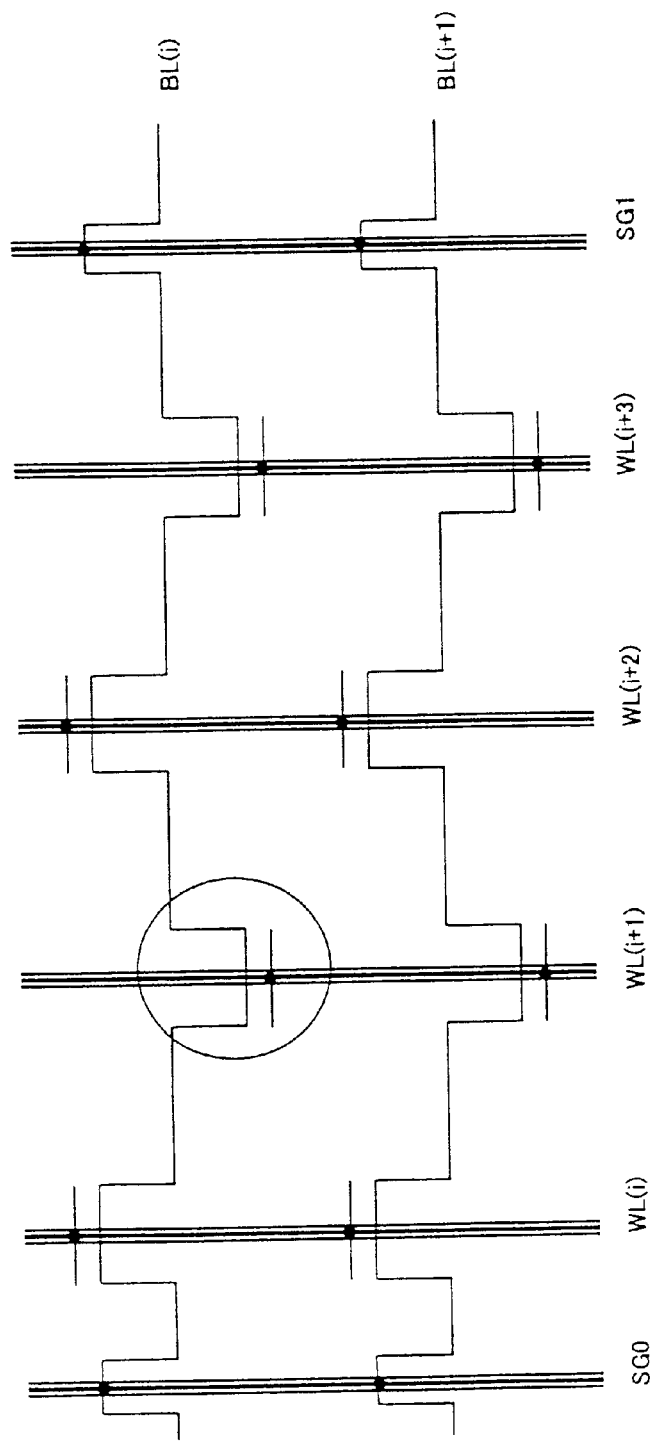
FIG. 25 is a circuit diagram showing the circuit construction of the flash-memory integrated circuit of FIG. 24.

FIG. 24 shows the construction of a flash-memory integrated circuit according to a sixth embodiment of the present invention while FIG. 25 shows the circuit diagram of the integrated circuit device of FIG. 24. In the drawings, those parts corresponding to the parts explained previously are designated with the same reference numerals and the description thereof will be omitted.

includes word lines WL(i)–WL(i+3) and that select gates SG0 and SG1 are formed outside of the word line WL(i) and outside of the word line WL(i+3) respectively. Further, a selection transistor is formed at the intersection of the select gate SG and the bit line BL(i) or the bit line BL(i+1).

The following Table 3 shows the operational condition of erasing, writing and reading of the memory cell (i+1) in the NAND-type flash-memory integrated circuit of FIG. 25.

TABLE 3

| Program | SG0 | 3V | Erase | SG0 | FLOAT | READ | SG0 | 5V |
|---|---|---|---|---|---|---|---|---|
| | SG1 | 0V | | SG1 | FLOAT | | SG1 | 5V |
| | BL(I) | 0V | | BL(I) | FLOAT | | BL(I) | ~1V |
| | BL(I + 1) | 3V | | BL(I + 1) | FLOAT | | BL(I + 1) | ~1V |
| | WL(I) | 10V | | WL(I) | 0V | | WL(I) | 5V |
| | WL(I + 1) | 20V | | WL(I + 1) | 0V | | WL(I + 1) | 0V |
| | WL(I + 2) | 10V | | WL(I + 2) | 0V | | WL(I + 2) | 5V |
| | WL(I + 3) | 10V | | WL(I + 3) | 0V | | WL(I + 3) | 5V |
| | p-well | 0V | | p-well | 15V | | p-well | 0V |
| | n-well | 0V | | n-well | 15V | | n-well | 0V |

Referring to FIG. 24, a double well structure including the n+-type well 21N formed outside the p+-type well 21P is formed in the Si substrate 11 along the active region 21B, similarly to the previous embodiment. Further, the word line WL and the select gate SG extend over the Si substrate 21 so as to intersect perpendicularly to the extending direction of the wells 21N and 21P. At the intersection point of the word line WL and the p+-type well 21P in the plane view of FIG. 24, n+-type diffusion regions 21S and 21D, which constitute the source region and the drain region of the flash memory device, are formed so as to be separated by a channel region that corresponds to the word line WL. Further, at the edge part of the p+-type well 21P, the n+-type diffusion regions 21S and 21D form the selection transistor together with the select gate SG. Thus, the n+-type diffusion regions 21S and 21D are formed in the p+-type well 21P so as to extend therewith alternately, repeatedly, and intermittently.

Further, there are formed buried diffusion regions 21A1–21A5 in the Si substrate 21 such that each of the buried diffusion regions 21A1–21A5 is connected to a corresponding word lines WL, wherein each of the buried diffusion regions 21A1–21A5 extends over a limited length in the direction parallel to the extending direction of the p+-type well 21P and the n+-type well 21N. Further, a number of floating gate electrodes 23 are formed on the Si substrate 21 via an intervening tunneling oxide film (not shown) such that the floating gate electrodes bridge the buried diffusion regions, such as the region 21A1 and the adjacent p+-type well 21P in the plan view of FIG. 24, and the floating gate electrode 23 forms a capacitance coupling with the buried diffusion region 21A1 and the gate oxide film (not shown). As a result, the electric potential of the floating gate electrode 23 is controlled through the buried diffusion region 21A1 in response to the voltage signal on the word line WL. Thus, writing and erasing of information are achieved by causing injection or pulling out of hot electrons to and from the floating gate electrode 23 between the source region 21S and the drain region 21D. Further, reading of information is achieved also between the source region 21S and the drain region 21D via the bit line BL.

Referring to the circuit diagram of FIG. 25, it can be seen that the NAND-type flash-memory integrated circuit Table 3 is referred to as an example.

At the time of the writing operation, a control voltage of +3V is applied to the select gate SG0 and the select gate SG1 is grounded. Further, the non-selected bit line BL(i) is grounded and a drive voltage of 3V is applied to the selected bit line BL (i+1). Furthermore, a controlled voltage of +10V is applied to the non-selected word lines WL(i), WL(i+2) and WL(i+3), and a writing voltage of about +20V is applied to the selected word line WL(i+1), and the p+-type well 21P and n+-type well 21N are grounded.

At the time of erasing operation, on the other hand, the select gates SG0 and SG1 are made to the floating state as shown in Table 3, and all the bit lines including the bit lines BL(i) and BL(i+1) are set to the floating state. Further, all the word lines including the word line WL(i)–WL(i+3) are grounded. In this state, an erasing voltage of +15V is applied to the p+-type well 21P and the n+-type well 21N. As a result, the electrons accumulated in the floating gate electrode 23 are pulled out to the Si substrate 21 in the foregoing memory cell.

At the time of reading operation, the p+-type well 21P and the n+-type well 21N are grounded and a control voltage of +5V is applied to the select gate SG0 and SG1. Further, a drive voltage of +1V is applied to the bit lines BL(i) and BL(i+1), and the selected word line WL(i+1) is grounded. Furthermore, a voltage of +5V is applied to the non-selected word lines WL(i) and WL(i+2), and WL(i+3).

Thus, according to this embodiment, it becomes possible to form a flash-memory integrated circuit of the NAND-type by using the flash memory device having a single-layer gate structure.

Figure 26:
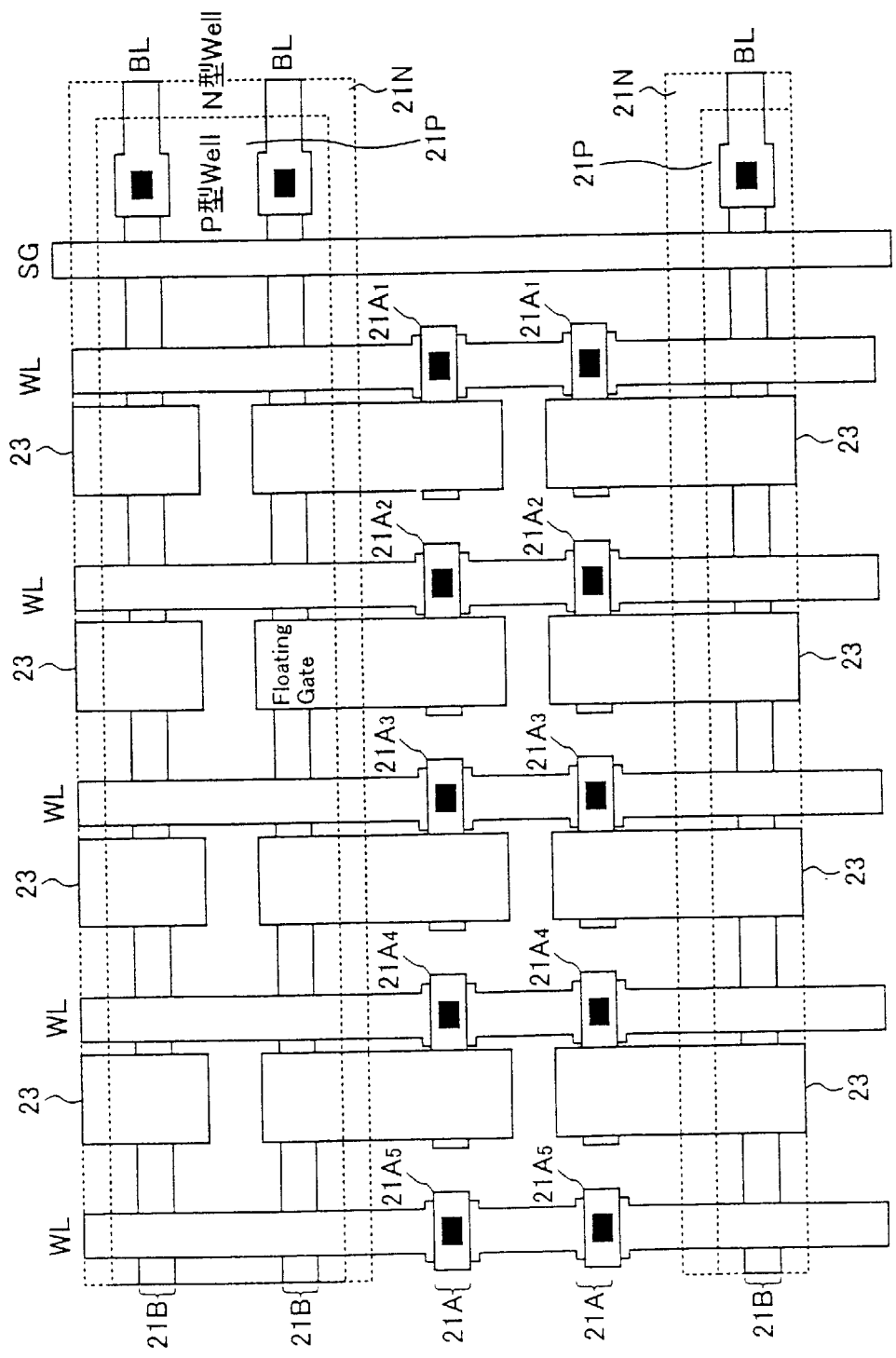
FIG. 26 is a diagram showing the layout of a modification of the flash-memory integrated circuit of FIG. 24.

Referring to FIG. 26, a pair of active regions 21B forming the second structural unit are formed commonly in the p-type well 21P in the present embodiment. As a result, it becomes possible to improve the integration density as compared with the layout of the previous embodiment of FIG. 23.

In the present embodiment, a pair of active regions 21B constituting the second structural unit are formed commonly in the p-type well 21P, and as a result, the integration density is improved as compared with the layout of the previous embodiment of FIG. 23.

Figure 27:
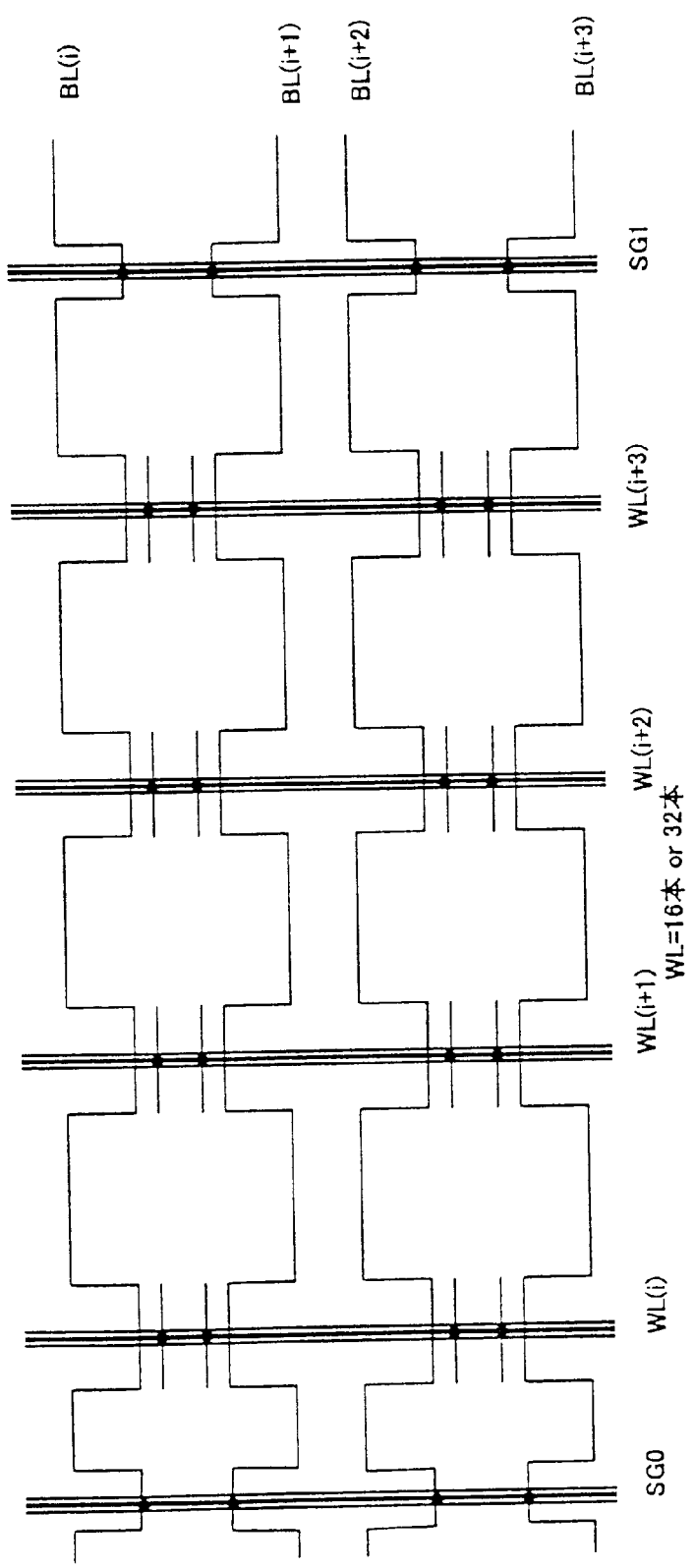
FIG. 27 is a diagram showing the construction of the flash-memory integrated circuit of FIG. 26.

As the writing, erasing and reading operations of the flash-memory integrated circuit of FIGS. 26 and 27 are similar to the previous embodiments, further description thereof will be omitted.

Further, the present invention is not limited to the embodiments described heretofore, but various variations and modifications may be made without departing from the scope of the invention.

What is claimed is:

1. A non-volatile semiconductor memory device, comprising:

a p-type Si substrate;

an n-type well formed in said Si substrate;

a control gate formed of a p-type buried diffusion region formed in said n-type well;

an active region formed in said Si substrate in the vicinity of said n-type well, said active region being covered by a tunneling insulation film; and a floating gate electrode formed on a surface of said Si subs rate so as to achieve a capacitance coupling with said p-type buried diffusion region, said floating gate electrode extending over said active region in a state that said tunneling insulation film is interposed between said floating gate electrode and said surface of said Si substrate, said active region including a pair of n-type diffusion regions at both sides of said floating gate electrode respectively as a source region and a drain region, said n-type diffusion region forming said source region having an n−-type diffusion region at the side facing said n-type diffusion region forming said drain region.

2. A non-volatile semiconductor memory device as claim 1, wherein said non-volatile semiconductor memory device forms a NOR-type flash memory.

3. A non-volatile semiconductor memory device as claimed in claim 2, wherein a negative voltage is applied to said control gate when erasing data from said non-volatile semiconductor memory device.

4. A semiconductor integrated circuit having a non-volatile memory cell array, comprising:

a p-type Si substrate;

a plurality of n-type wells formed repeatedly on said Si substrate, each of said n-type wells extending in said Si substrate in a first direction;

a control gate formed of a p-type buried diffusion region, said p-type buried diffusion region being formed in each of said n-type wells so as to extend in said first direction;

a plurality of active regions formed on said Si substrate between a pair of adjacent n-type wells, each of said active regions extending in said first direction and being covered with a tunneling insulation film;

a floating gate electrode provided on each of said n-type wells so as to achieve a capacitance coupling with said p-type buried diffusion region in said n-type well via an insulation film covering said surface of said Si substrate, said floating gate electrode extending over an active region adjacent to n-type well;

n-type diffusion regions formed at both sides of said floating gate electrode in each of said active regions;

a pair of bit lines extending over said Si substrate in a second direction crossing said first direction across said plurality of n-type wells and said plurality of active regions, said bit lines making a contact with corresponding n-type diffusion regions in each of sa d active regions; and a plurality of word lines respectively extending over said Si substrate in said first direction in correspondence said plurality of n-type wells, each of said word lines making a contact with a control gate in a corresponding n-type well, a first floating gate electrode bridging across a first active region and a second active region adjacent to said first active region at a first side of said first active region when viewed in a direction perpendicular to said substrate, a second floating gate electrode adjacent said first floating gate electrode bridging across said first active region and a third active region adjacent to said first active region at a second, opposite side of said first active region when viewed in a direction perpendicular to said substrate.

5. A semiconductor integrated circuit having a non-volatile memory cell array, comprising:

a p-type Si substrate;

a plurality of n-type wells formed on said Si substrate repeatedly, each of said n-type wells extending in said Si substrate in a first direction;

a pair of buried diffusion regions formed in each of said n-type wells so as to extend in said first direction, each of said pair of buried diffusion regions forming a control gate;

a pair of active region formed on a surface of said Si substrate in a part located between a pair of neighboring n-type wells, each of said active regions extending in said first direction and being covered with a tunneling insulation film;

a floating gate electrode provided on each of said n-type wells so as to achieve a capacitance coupling with one of said p-type buried diffusion regions in said n-type well via an insulation film covering said surface of said Si substrate, said floating gate electrode extending over said active region adjacent to said n-type well;

a pair of n-type diffusion regions formed in each of said active regions at both sides of said floating gate electrode;

a pair of bit lines extending over said Si substrate in a second direction crossing said first direction across said plurality of n-type wells and said plurality of active regions, each of said bit lines making a contact with a corresponding n-type diffusion region in each of said active regions; and a plurality of word lines extending over said Si substrate in said first direction respectively in correspondence to said plurality of n-type wells, each of said word lines making a contact with a control gate in a corresponding n-type well.

6. A method of fabricating a non-volatile semiconductor memory device, comprising the steps of:

forming a first and second, mutually separate active regions on a substrate such that said first region is covered with a first insulation film acting as a tunneling insulation film and such that said second region is covered with a second insulation film acting as a gate insulation film;

forming a well of a first conductivity type in said substrate in correspondence to said second active region;

forming a diffusion region of a second conductivity type in said well such that said second insulation film covers a surface of said diffusion region; and providing a floating electrode on said substrate such that said floating electrode covers continuously said first insulation film in said first active region and said second insulation film in said second active region; and forming a source region and a drain region of n+-type in said first active region at both lateral sides of said floating gate electrode, such that said source region includes a diffusion region of n--type at a side facing said drain region.

* * * * *